(12) United States Patent
Haenlein et al.

(10) Patent No.: US 12,096,551 B2
(45) Date of Patent: Sep. 17, 2024

(54) TRANS-VACUUM PRINTED FLEXIBLE WIRING APPARATUS

(71) Applicant: Equal 1 Laboratories Ireland Limited, Wicklow (IE)

(72) Inventors: Hans Haenlein, Cupertino, CA (US); Dirk Robert Walter Leipold, Fremont, CA (US); Ali Esmailiyan, Dublin (IE)

(73) Assignee: EQUAL 1 LABORATORIES IRELAND LIMITED, Wicklow (IE)

( * ) Notice: Subject to any disclaimer, the term of this patent is extended or adjusted under 35 U.S.C. 154(b) by 358 days.

(21) Appl. No.: 17/834,971

(22) Filed: Jun. 8, 2022

(65) Prior Publication Data
US 2023/0403784 A1    Dec. 14, 2023

(51) Int. Cl.
*H05K 1/11*        (2006.01)
*F17C 13/00*       (2006.01)
(Continued)

(52) U.S. Cl.
CPC ......... *H05K 1/0224* (2013.01); *H01B 7/0861* (2013.01); *H01R 12/594* (2013.01);
(Continued)

(58) Field of Classification Search
CPC .... H05K 1/0224; H05K 1/0393; H05K 1/118; H05K 1/147; H05K 1/189; H05K 2201/0154; H05K 2201/0715; H05K 2201/09681; H05K 2201/10189; H05K 2201/10356; H05K 2201/09027; H05K 2201/09081; H05K 2201/09; H05K 2201/09009; H05K 2201/09036; H05K 2201/09072; H05K 2201/055; H01B 7/0861; H01R 12/594; H01R 12/77–777; H01R 12/06; H01R 13/5202;
(Continued)

(56) References Cited

U.S. PATENT DOCUMENTS

| 4,206,354 | A | * | 6/1980 | Small, Jr. ................. F17C 3/085 250/352 |
| 4,451,735 | A | * | 5/1984 | Diedrich ................. H01B 17/30 257/E31.117 |

(Continued)

*Primary Examiner* — Roshn K Varghese
(74) *Attorney, Agent, or Firm* — Zaretsky Group PC; Howard Zaretsky

(57) ABSTRACT

A novel and useful system wiring apparatus and related techniques that address the need to feed power and electronic signals to and from a sample board between the cold, low pressure region in a vacuum chamber and outside room temperature and atmospheric pressure. The wiring apparatus balances electrical resistance with the thermal conductivity of the power and signal conductors. Printed flexible cables are used having an annular sealing region which together with O-rings provide vacuum sealing while allowing electrical signals to pass between integrated circuit(s) inside the vacuum chamber and equipment outside the chamber. A thermal anchor is placed along the printed flexible cable to maintain a desired temperature along the cable. The printed flexible circuits are multilayer with two outer layers serving as an RF shield while two inner layers comprise the signal lines which typically require shielding, electrical isolation from each other and from external electromagnetic fields.

20 Claims, 19 Drawing Sheets

(51) Int. Cl.
 *H01B 7/08*  (2006.01)
 *H01R 12/59*  (2011.01)
 *H01R 12/77*  (2011.01)
 *H01R 12/79*  (2011.01)
 *H05K 1/02*  (2006.01)
 *H05K 1/03*  (2006.01)
 *G06N 10/40*  (2022.01)

(52) U.S. Cl.
 CPC ........... *H01R 12/775* (2013.01); *H01R 12/79* (2013.01); *H05K 1/0393* (2013.01); *H05K 1/118* (2013.01); *G06N 10/40* (2022.01); *H05K 2201/0154* (2013.01); *H05K 2201/0715* (2013.01); *H05K 2201/09681* (2013.01); *H05K 2201/10189* (2013.01); *H05K 2201/10356* (2013.01)

(58) Field of Classification Search
 CPC . H01R 13/5205; H01R 13/533; F17C 13/085; F17C 13/006; G06N 10/40
 See application file for complete search history.

(56) References Cited

U.S. PATENT DOCUMENTS

| | | |
|---|---|---|
| 4,712,388 A | 12/1987 | Sullivan |
| 8,441,329 B2 | 5/2013 | Thom |
| 10,785,891 B1 | 9/2020 | Monroe |
| 11,425,841 B2 | 8/2022 | Hart |
| 2019/0348251 A1 | 11/2019 | Monroe |
| 2021/0255076 A1 | 8/2021 | Chan |
| 2023/0168023 A1 | 6/2023 | Lohmann |

\* cited by examiner

TRANS-VACUUM PRINTED FLEXIBLE WIRING APPARATUS

FIELD OF THE DISCLOSURE

The subject matter disclosed herein relates to the field of quantum computing and more particularly relates to a cryostat system including printed flexible cables, vacuum sealing, and suspended sample board.

BACKGROUND OF THE INVENTION

Quantum computing is a new paradigm that exploits fundamental principles of quantum mechanics, such as superposition and entanglement, to tackle problems in mathematics, chemistry and material science that are well beyond the reach of supercomputers. Its power is derived from a quantum bit (qubit), which can simultaneously exist as a superposition of both 0 and 1 states and can become entangled with other qubits. This leads to doubling the computational power with each additional qubit, which can be repeated many times. It has been already shown that quantum computers can speed up some of the algorithms and, potentially, model any physical process.

Operating electronics including quantum circuits under cryogenic conditions (i.e. temperatures below −180° C./93K) is useful for the operation of certain types of silicon devices, such as thermal detectors and quantum computer circuitry. Maintaining cryogenic conditions in an experimental or operational region requires a heat pump to remove the heat from that region, and a cryostat to minimize the heat transfer from the surroundings back into the region.

There is also a need to provide a path for electrical signals including data, control, and power lines to enter and exit the cold, low pressure region inside a vacuum chamber from the outside which is typically at room temperature and at atmospheric pressure while providing a sufficient seal to maintain the vacuum within the chamber.

SUMMARY OF THE INVENTION

The following summary is illustrative only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

The present invention is a wiring apparatus and related techniques that address the need to feed power and electronic signals into and out of the cold, low pressure region in a vacuum chamber to the outside which is typically at room temperature and atmospheric pressure. The wiring apparatus also functions to balance electrical resistance with the thermal conductivity of the power and signal conductors. Copper is most often used to transmit electronic signals, but as stated supra, it is also used as a good thermal conductor. Note that thermal conductivity and electrical conductivity are related by the Wiedemann-Franz law which states that the ratio of the electronic contribution of the thermal conductivity ($\kappa$) to the electrical conductivity ($\sigma$) of a metal is proportional to the temperature (T).

In the development of cryo-electronic systems, it is preferable to produce wiring solutions that can be assembled consistently, and that can be modified quickly and cost effectively, in order to more quickly determine the correct balance between thermal and electronic performance. When mass producing such cryo-electronic systems, it is also important to maximize component functionality and reliability while minimizing complexity, part count and ultimately cost.

In one embodiment, both the TV flex printed circuit as well as the cryo flex printed circuit are multilayer and in one example embodiment comprise four layers. The two outer layers serve as electromagnetic shields while the two inner layers comprise the signal lines which typically require electromagnetic shielding, electrical isolation from each other and from external electromagnetic fields. In one embodiment, the electromagnetic shield is not solid and comprises a mesh pattern (e.g., diamond, hexagons, octagons, or other polygon shape) making it more flexible. Preferably, the RF cutoff frequency of the printed shield is high enough to act as a solid shield without creating too much conductance. The mesh preferably minimizes conductivity while still providing sufficient RF shielding. Thus, the cable enables effective shielding by optimizing the scale and size of the mesh, while minimizing the total cross sectional area of copper running up and down the flex cables, and therefore its thermal conductivity.

There is thus provided in accordance with the invention, a trans-vacuum flexible wiring apparatus for use in a cryostat, comprising a flat laminated flexible material having an annular shaped sealing region able to be vacuum sealed between a cover plate and a perimeter of a hole in a vacuum chamber of the cryostat, and a plurality of electrically conductive traces that cross the annular shaped region thereby passing electrical signals between an air side and a vacuum side of the cryostat.

There is also provided in accordance with the invention, a trans-vacuum flexible wiring apparatus for use in a cryostat, comprising a continuous annular shaped laminated flexible material having a concentric sealing region able to be vacuum sealed between a cover plate and a perimeter of a hole in a vacuum chamber of the cryostat and whose outer perimeter is offset from an outer shape of the cover plate, and a plurality of electrically conductive printed traces that axially cross the annular laminated flexible material thereby passing signals between one or more first flexible tabs from an air side of the cryostat and one or more second flexible tabs on a vacuum side of the cryostat.

There is further provided in accordance with the invention, a trans-vacuum flexible wiring apparatus for use in a cryostat, comprising a flat laminated flexible material having a plurality of printed layers and an annular shaped sealing region able to be vacuum sealed between a cover plate and a perimeter of a hole in a vacuum chamber of the cryostat, and a plurality of electrically conductive traces fabricated on the plurality of printed layers that cross the annular shaped region thereby passing electrical signals between an air side and a vacuum side of the cryostat.

BRIEF DESCRIPTION OF THE DRAWINGS

The present invention is explained in further detail in the following exemplary embodiments and with reference to the figures, where identical or similar elements may be partly indicated by the same or similar reference numerals, and the features of various exemplary embodiments being combinable. The invention is herein described, by way of example only, with reference to the accompanying drawings, wherein.

DETAILED DESCRIPTION

Figure 1A:
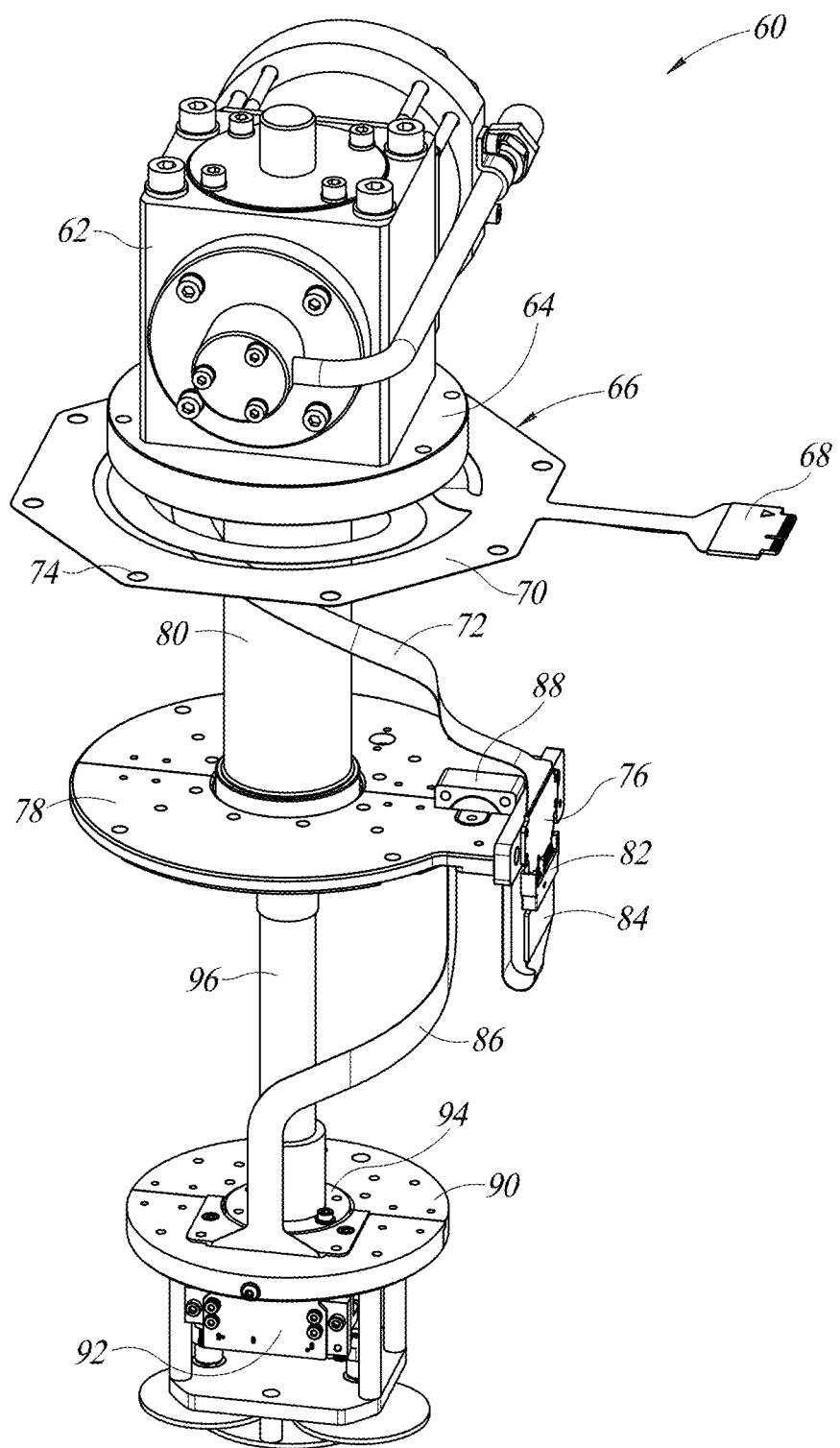
FIG. 1A is a perspective view diagram illustrating a first example cryostat system constructed in accordance with the present invention.

In the following detailed description, numerous specific details are set forth in order to provide a thorough understanding of the invention. It will be understood by those skilled in the art, however, that the present invention may be practiced without these specific details. In other instances, well-known methods, procedures, and components have not been described in detail so as not to obscure the present invention.

Among those benefits and improvements that have been disclosed, other objects and advantages of this invention will become apparent from the following description taken in conjunction with the accompanying figures. Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary, for the understanding and appreciation of the underlying concepts of the present invention and in order not to obfuscate or distract from the teachings of the present invention.

Any reference in the specification to a method should be applied mutatis mutandis to a system capable of executing the method. Any reference in the specification to a system should be applied mutatis mutandis to a method that may be executed by the system.

Throughout the specification and claims, the following terms take the meanings explicitly associated herein, unless the context clearly dictates otherwise. The phrases "in one embodiment," "in an example embodiment," and "in some embodiments" as used herein do not necessarily refer to the same embodiment(s), though it may. Furthermore, the phrases "in another embodiment," "in an alternative embodiment," and "in some other embodiments" as used herein do not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

A perspective view diagram illustrating a first example cryostat system constructed in accordance with the present invention is shown in FIG. 1A. The cryostat, generally referenced 60, comprises a cold head 62 and mounting plate 64 that sit outside the vacuum chamber and extends through an opening at the top downward towards the sample board near the bottom. The cryocooler includes concentric tubes or shafts that provide two stages of cooling. The top portion 80 of the cryocooler shaft cools the first stage 78 to approximately 30 kelvin (i.e. 30K). The bottom portion 96 of the cryocooler shaft cools the second stage 90 and cold mounting plate 94 to approximately 3 degrees K.

In one embodiment, the cryostat employs a vacuum (or partial vacuum) to remove the gases that would conduct and convect external heat back into the region, polished surfaces, gold plating to minimize heat radiation into the region, certain materials such as stainless steel (a poor heat conductor) to minimize conduction where needed, and copper (an excellent heat conductor) to maximize heat conduction where needed.

In another embodiment, the TV flex circuit is mounted on the top of the vacuum chamber. The top of the chamber is where the cryogenic cooler apparatus passes through a hole in the vacuum chamber as well as a corresponding hole in the TV flex circuit. Vacuum sealing utilizes O-rings to seal against the annular sealing region portion of the flex circuit. A spiral tab extending into the vacuum chamber is adapted to have a path around the cryogenic cooler head assembly.

A trans-vacuum (TV) flexible circuit or wiring apparatus 66 functions to provide electrical connections between outside the vacuum chamber via connector 68 and the sample board via PCB assembly 92. The TV flex circuit has an annular ring portion 70 that forms part of the vacuum seal. Electrical connections cross the annular ring and form a spiral path 72 around the cooling shaft 80 to a PCB assembly 76. A plurality of holes 74 allow for fasteners to secure a cover plate. A second flexible circuit cable 86 (also referred to as a cryo-flex cable) is coupled to the TV flex cable via PCB assembly 84 and connector 82. In one embodiment, the PCB assembly 76 is mounted to the first stage cold plate 78 which is held at approximately degrees K. To address convention and radiative heat loss, the first and second stage cold plates 78, 90 are solid copper and plated with gold to make them very reflective.

The cryo-flex cable passes through a thermal anchor 88 that clamps the temperature at that point in the cable to the first stage temperature of approximately 30 degrees K. The cryo-flex cable forms a loop between the thermal anchor 88 and the connector 82. The connector is adapted to provide good electrical conductivity but poor thermal conductivity to provide a degree of thermal isolation between the two flex cables. The cryo-flex cable 86 continues downward along the cooling shaft 96 to the cold mounting/fastening plate 94 and second stage which is maintained at 3K. In addition, since the PCB assembly 76 is clamped to the first cooling stage which has far more cooling capacity (e.g., 50 W) than the second cooling stage (e.g., 200 mW), it is preferable to place at the first stage location any power hungry circuity such as RF attenuators, amplifiers, and/or power supply regulators which are used to reduce noise in the RF signals. Other circuitry such as transceiver circuits or intermediate amplifier circuits for high speed communication can also be placed at this location.

It is noted that using two flex cables with a thermal break and electrical connection between them (i.e. two stage design of TV-flex and cryo-flex cables) versus using a single cable is far more energy efficient. Use of two cables in going from 300K to 30K and then 30K to 3K lowers the energy loss than use of a single cable with the same temperature span of 300K to 3K. This is because any kind of thermal contact that must be cooled to 3K consumes much more energy compared with being cooled first to 30K and then to 3K. Note that the thermal conductivity of copper increases as it is cooled and has a peak at approximately 20K. Although copper is a good electrical conductor it is also a good thermal conductor which is not desirable in this case inside the cryostat vacuum chamber. This is because the 3K at the second stage sample board can creep along the copper traces of the printed flexible cable. As each further region of copper is cooled, its thermal conductivity increases and losses would also increase along the path of the cable. Thus, the thermal anchor stops this process from continuing along the cable.

In one embodiment, the flex circuits comprise four layers with the two outer layers functioning as RF shielding. The electromagnetic shielding layers may be solid metal but to improve flexibility at low temperatures they preferably have a non-solid pattern. For example a honeycomb, diamond, octagonal, hexagonal, or other polygon shaped pattern of relatively thin traces can be used, which yield a minimum amount of metal (e.g., copper) to provide RF shieling while retaining flexibility at low temperatures and also minimizing thermal conductivity along the cable. The multiple layers of the cable provide electrical isolation between the individual signal traces whether single ended or balanced, differential, as well as isolation from external electromagnetic fields. Further, the RF and microwave lines of the flex cables can be impedance controlled and well isolated from each other in left, right, up, and down directions in relation to their position in the cable, which improves performance. Thus, the cable can enable effective shielding by optimizing the scale and size of the mesh, while minimizing the total cross sectional area of copper running up and down the flex cables, and therefore its thermal conductivity.

Note that the shielding is solid and planar and not a mesh in the outer two layers of the cable in the region of the annular vacuum seal of the TV flex circuit. This is because the O-rings that provide the sealing prefer to seal against a solid planar surface and not the thin mesh pattern of the shield.

Note further that the width and thickness of the copper traces used in the flex cables may be fabricated having any desired size in order to manage their electrical and thermal conductivity in accordance with the particular implementation of the invention.

Figure 1B:
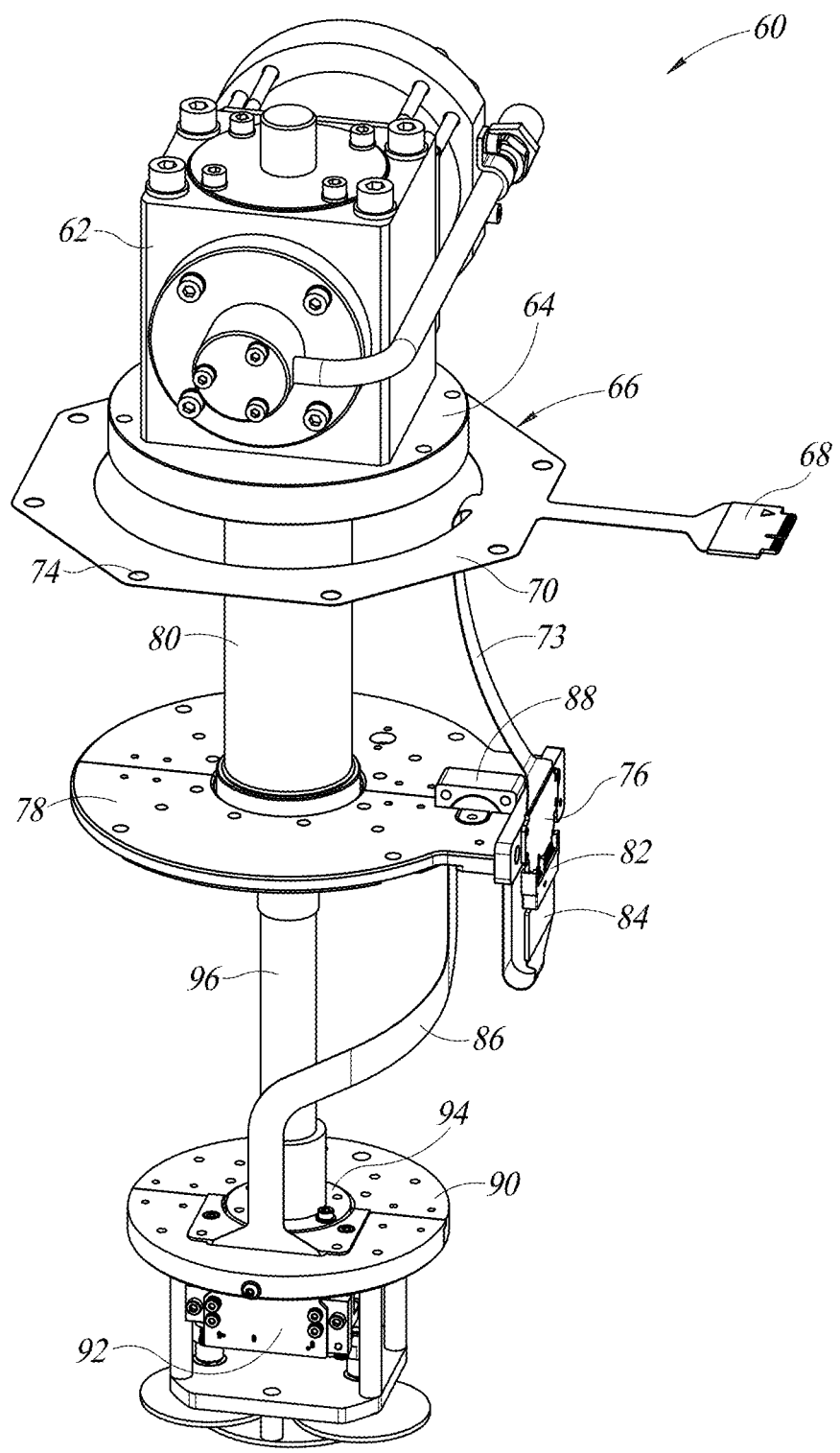
FIG. 1B is a perspective view diagram illustrating a second example cryostat system constructed in accordance with the present invention.

A perspective view diagram illustrating a second example cryostat system constructed in accordance with the present invention is shown in FIG. 1B. This embodiment is similar to the TV flex circuit of FIG. 1A with the difference being that the spiral portion 72 of the circuit is replaced with a straight portion 73 that leads to connector 82.

Figure 2A:
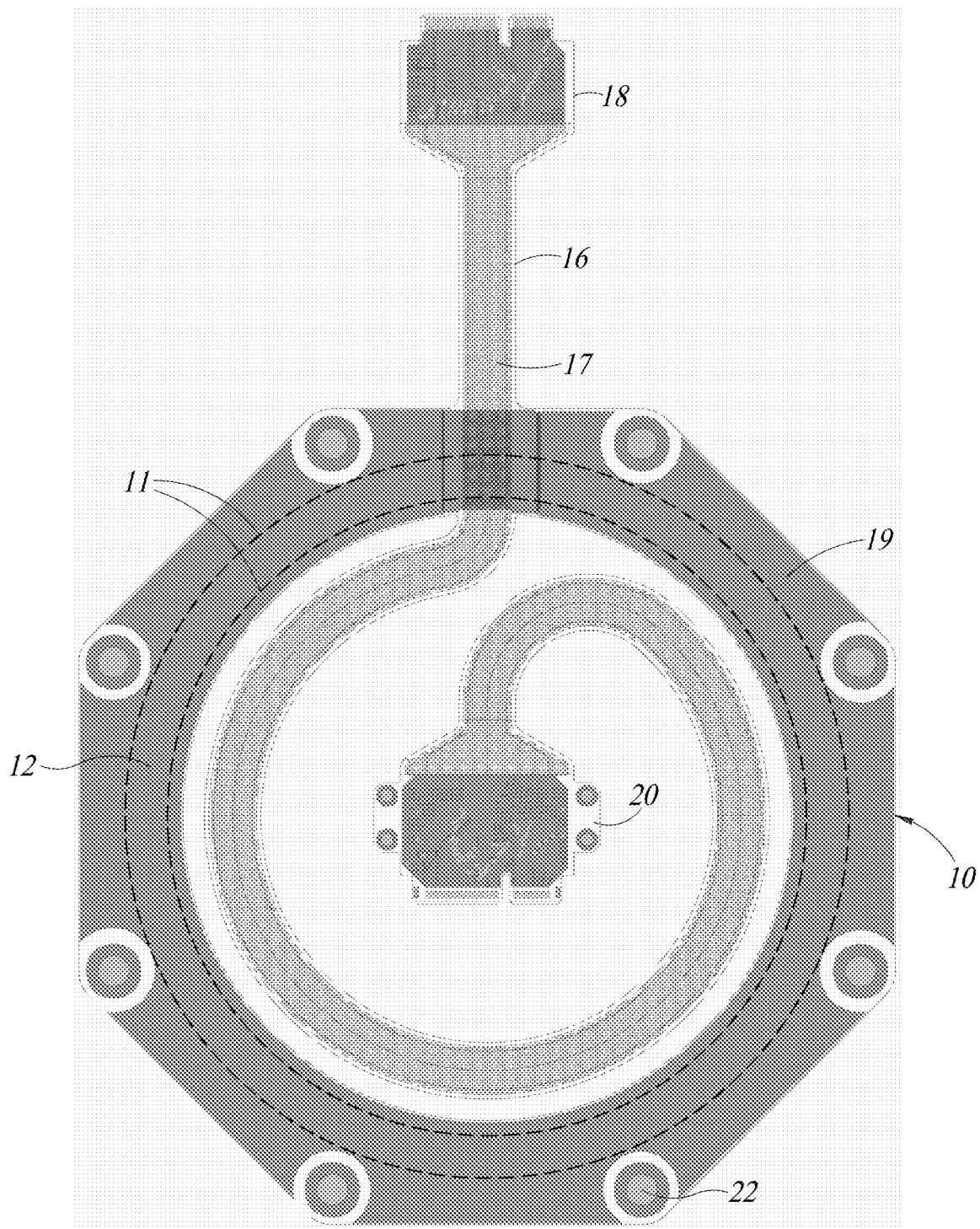
FIG. 2A is a diagram illustrating a top layer of a first example trans-vacuum flexible printed circuit having rigid printed circuit board tabs.
Figure 2B:
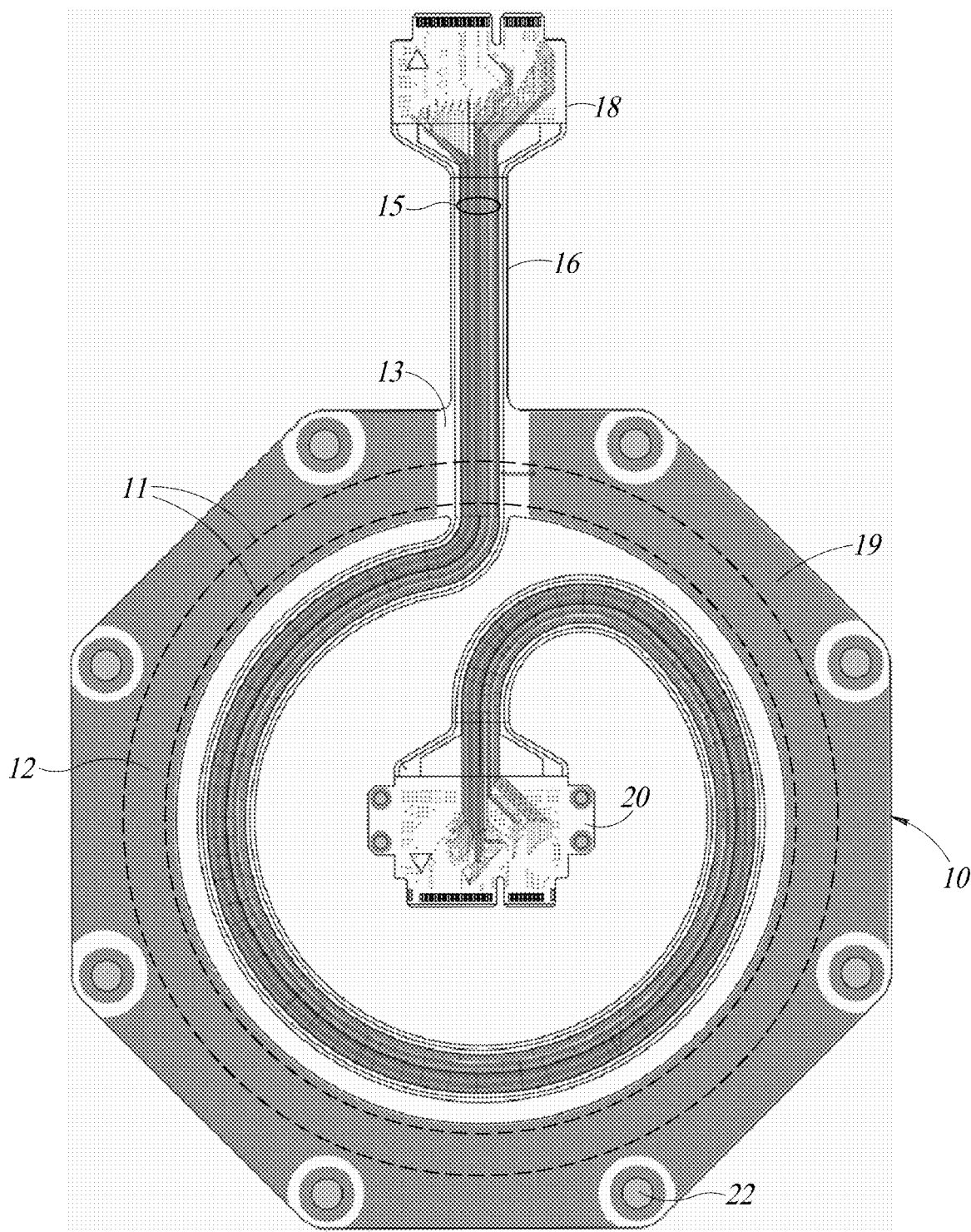
FIG. 2B is a diagram illustrating a middle layer of a first example trans-vacuum flexible printed circuit having rigid printed circuit board tabs.

A diagram illustrating a top (and bottom) layer of a first example trans-vacuum flexible printed circuit having rigid printed circuit board tabs is shown in FIG. 2A. A diagram illustrating inner electrical signal layers of a first example trans-vacuum flexible printed circuit having rigid printed circuit board tabs is shown in FIG. 2B.

The trans-vacuum (TV) flexible circuit or wiring apparatus, generally referenced 10, comprises an annular sealing region 12 adapted to receive one or more O-rings to create a vacuum seal around the perimeter of an opening in a vacuum chamber. The TV flex circuit also comprises a plurality of electrical traces 15 that run between two rigid printed circuit board (PCB) edge connectors 18, 20. The electrical traces 15 extend through a flex tab 16, cross the annular sealing region 12 through a gap 13 in the RF shielding mesh 17 and continue through tab 14 to rigid PCB connector 20.

The TV flex circuit uses well-known printed circuit board flex circuit technology to integrate a vacuum seal with the electrical conductors that need to pass through from the air side to the vacuum side of a cryostat. In one embodiment, the TV flex circuit enables the feedthrough of up to 84 separate signals with less than 50 mW thermal power penalty.

Note that in this example embodiment, the electrical traces cross axially or perpendicular to the annular sealing region. In alternative embodiments, the electrical traces cross tangentially at any desired angle depending on the particular application. In addition, flex tab 14 is shown having a shape of a spiral in order to maximize the length of the flex tab during manufacture. Alternatively, the flex tab 14 can have any desired shape and is not limited to a spiral shape.

As described supra, the TV flex cable comprises an RF shield mesh 17 on its two outer layers. In the area of the annular sealing region delineated by the dashed concentric circles 11 and extending to the edges of the flex circuit, however, a solid or semi-solid pattern 19 replaces the mesh 17 in order to enable better vacuum sealing against the O-rings. On the signal layers, a gap 13 in the solid or semi-solid pattern 19 is placed on either side of the signal traces 15.

Figure 2C:
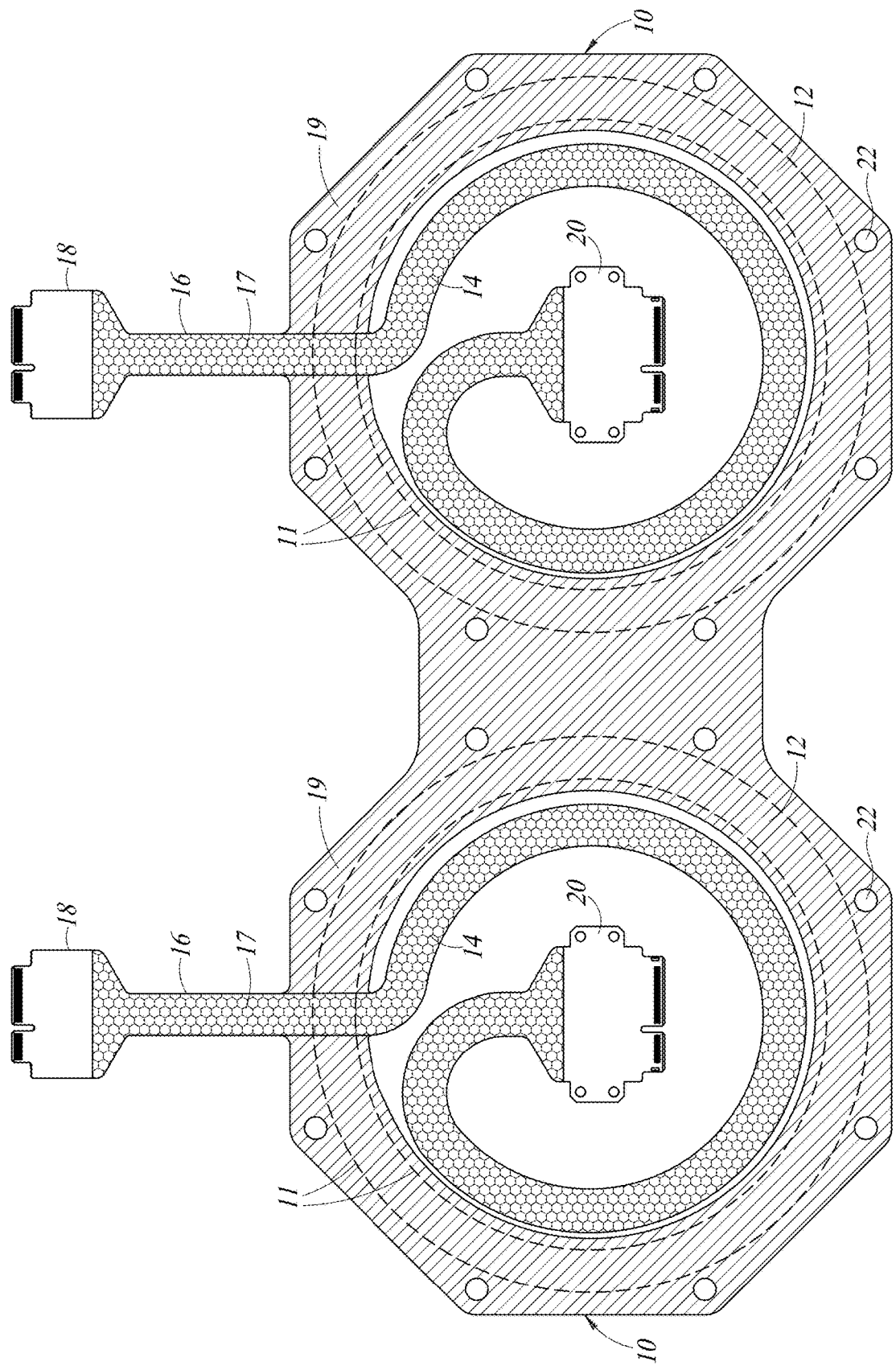
FIG. 2C is a diagram illustrating a top view of a second example trans-vacuum flexible printed circuit having rigid printed circuit board tabs.

A diagram illustrating a top view of a second example trans-vacuum flexible printed circuit having rigid printed circuit board tabs is shown in FIG. 2C. In this embodiment, two TV flex cables are mated into a single assembly. This is useful for the case where the cryostat incorporates two cold heads rather than one. The two cold heads penetrate the vacuum chamber and the TV flex printed circuits provide a path for electrical signals and power to enter and exit the vacuum chamber while providing sealing around the two openings. The operation of each of the two TV flex cables is the same as in the single TV flex cable case described supra. Note that in an alternative embodiment the cryostat may comprise more than two cold heads and corresponding additional TX flex printed circuits.

Figures 2D, 2E:
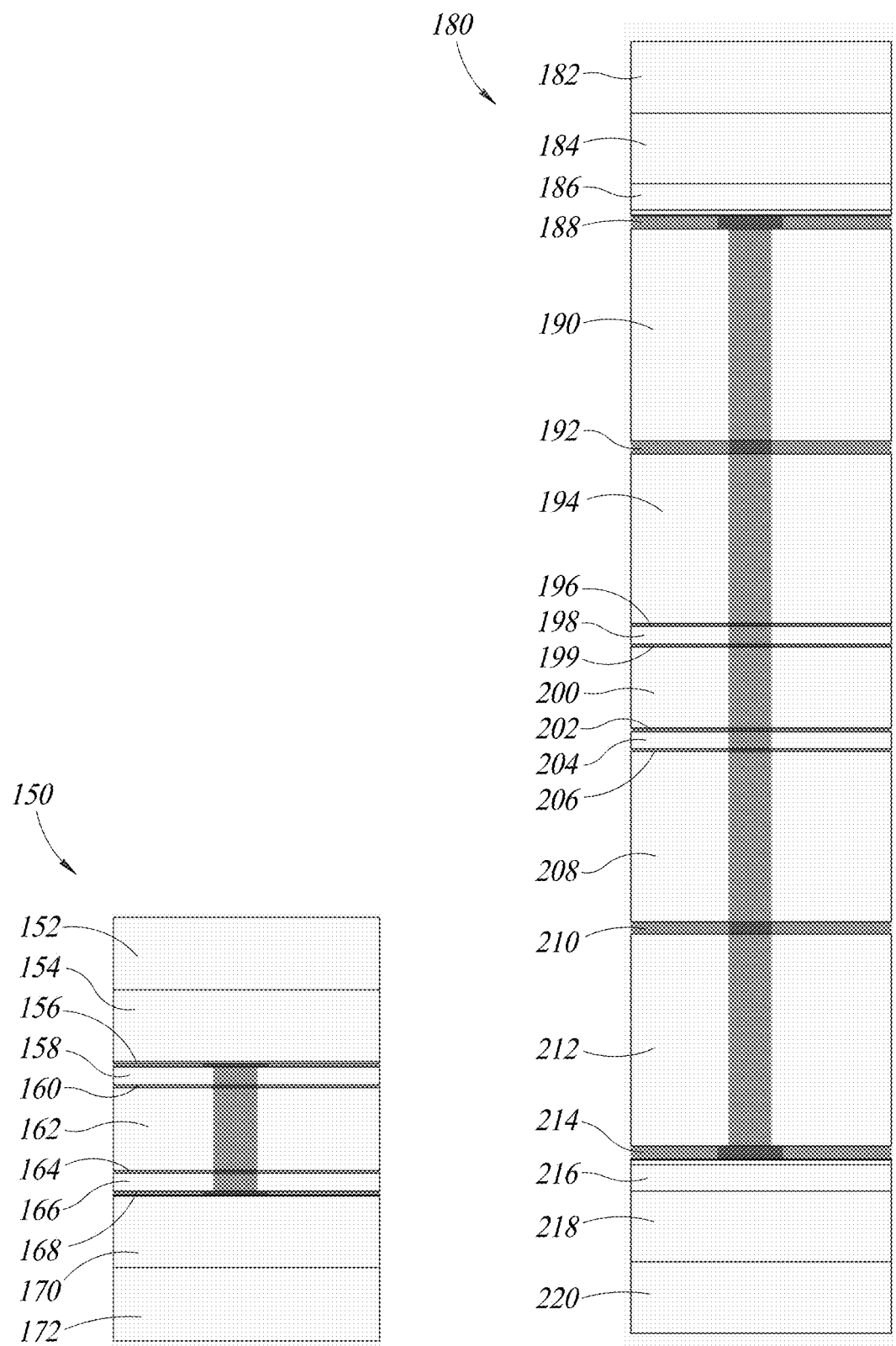
FIG. 2D is a diagram illustrating a cross sectional view of a first example trans-vacuum flexible printed circuit.
FIG. 2E is a diagram illustrating a cross sectional top view of a first example trans-vacuum flexible printed circuit rigid printed circuit board tabs.

A diagram illustrating a cross sectional view of a first example trans-vacuum flexible printed circuit is shown in FIG. 2D. In one embodiment, the TV flex cable 150 comprises four electrical layers 156, 160, 164, 168 surrounded by several outer layers. The outer layers 152, 172 comprise cover layers of polyimide. The layers below these, namely 154, 170, comprise adhesive acrylic and/or polyimide. The top and bottom electrical layers 156, 168 comprise copper mesh 17 that functions as RF electromagnetic shielding. The internal electrical layers 160, 164 comprise copper signal traces. The four electrical layers are separated by dielectric layers 158, 162, 166 that may comprise polyimide or an adhesive thermoset material. In addition, the inner dielectric layer 162 separating the signal layers 160, 164 may be thicker, e.g., 4.6 mil versus 1.0 mil for layers 158, 166. In addition, the copper signal traces in all four electrical layers are made as thin as practical to minimize thermal conductivity while also providing sufficient electrical conductivity.

A diagram illustrating a cross sectional top view of a first example trans-vacuum (TV) flexible printed circuit rigid printed circuit board tabs is shown in FIG. 2E. In one embodiment, the rigid PCB 180 comprises eight layers including four electrical copper layers 196, 199, 202, 206 and four electrical copper PCB layers 188, 192, 210, 214, four polyimide dielectric PCB layers 190, 194, 208, 212. The electrical layers 196, 199, 202, 206 are separated by dielectric layers 198, 200, 204 that may comprise polyimide or an adhesive thermoset material. The PCB layers are surrounded by solder paste layers 186, 216, adhesive acrylic layers 184, 218, and polyimide cover layers 182, 220. Electrical connections between the signal traces in the flexible cable and the copper conductor PCB layers are made using a plurality of vias. This requires accurate alignment of the flex circuit and PCB layers. Thus, the terminal ends of the TV flex cable are sandwiched during manufacturing between multiple PCB layers. These rigid PCB assemblies at either end of the cable comprise a plurality of edge connectors and in addition may comprise circuitry and other components depending on the implementation.

Figure 2F:
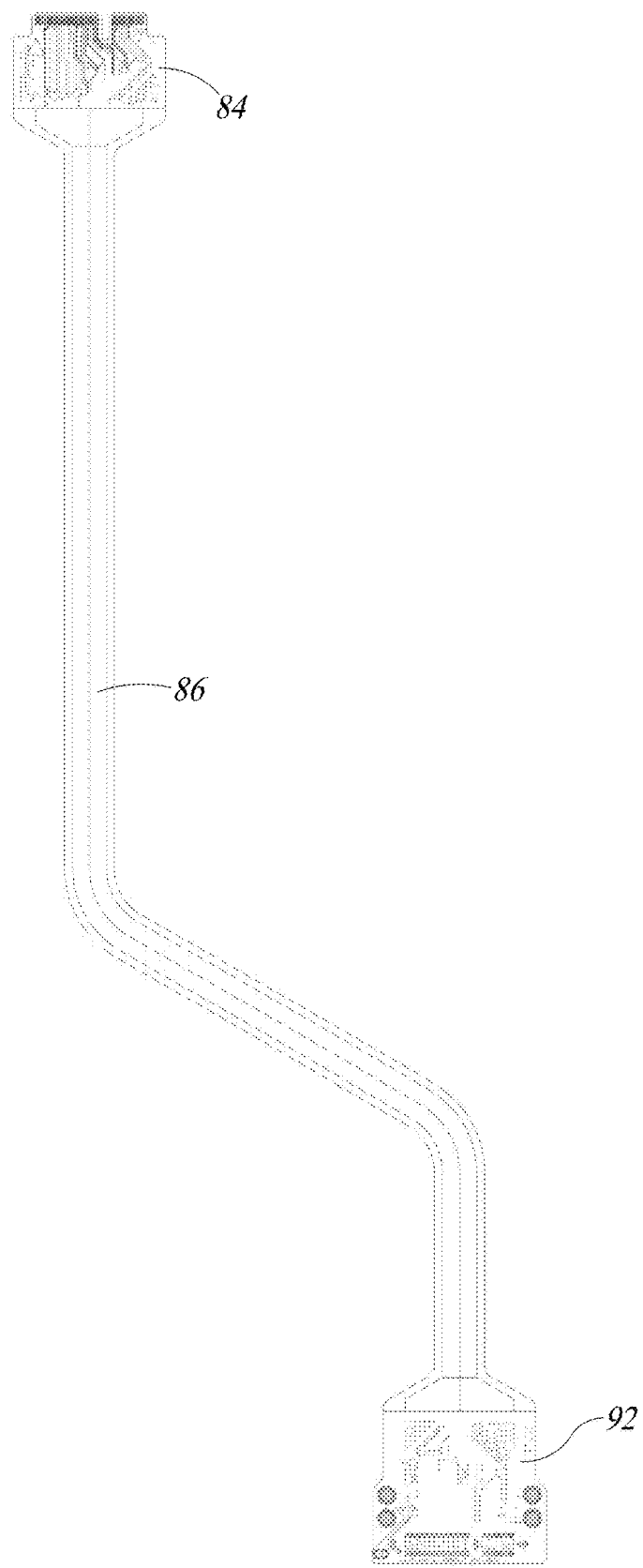
FIG. 2F is a diagram illustrating a top view of a cryostat flexible printed circuit having rigid printed circuit board tabs.

A diagram illustrating a top view of a cryostat flexible printed circuit having rigid printed circuit board tabs is shown in FIG. 2F. The cryostat flexible printed cable 86 is terminated on either end by rigid PCB tabs 84, 92. In one embodiment, the cryostat flexible printed cable is constructed similarly to the TV flex printed cable with the different between that the cryostat flexible printed cable comprises two electrical layers instead of four. In this case, the two electrical layers comprise signal layers as the RF electromagnetic shielding layers are not necessary as the cable resides completely within the electrically insulated vacuum chamber.

Similar to the TV flex printed cable described supra, several PCB layers surround the ends of the cryostat flexible printed cable to form the rigid PCB assemblies 84, 92. Electrical connections between the signal traces in the cryostat flexible cable and the copper conductor PCB layers are made using a plurality of vias. This typically requires accurate alignment of the flex circuit and PCB layers during manufacturing.

Figure 3A:
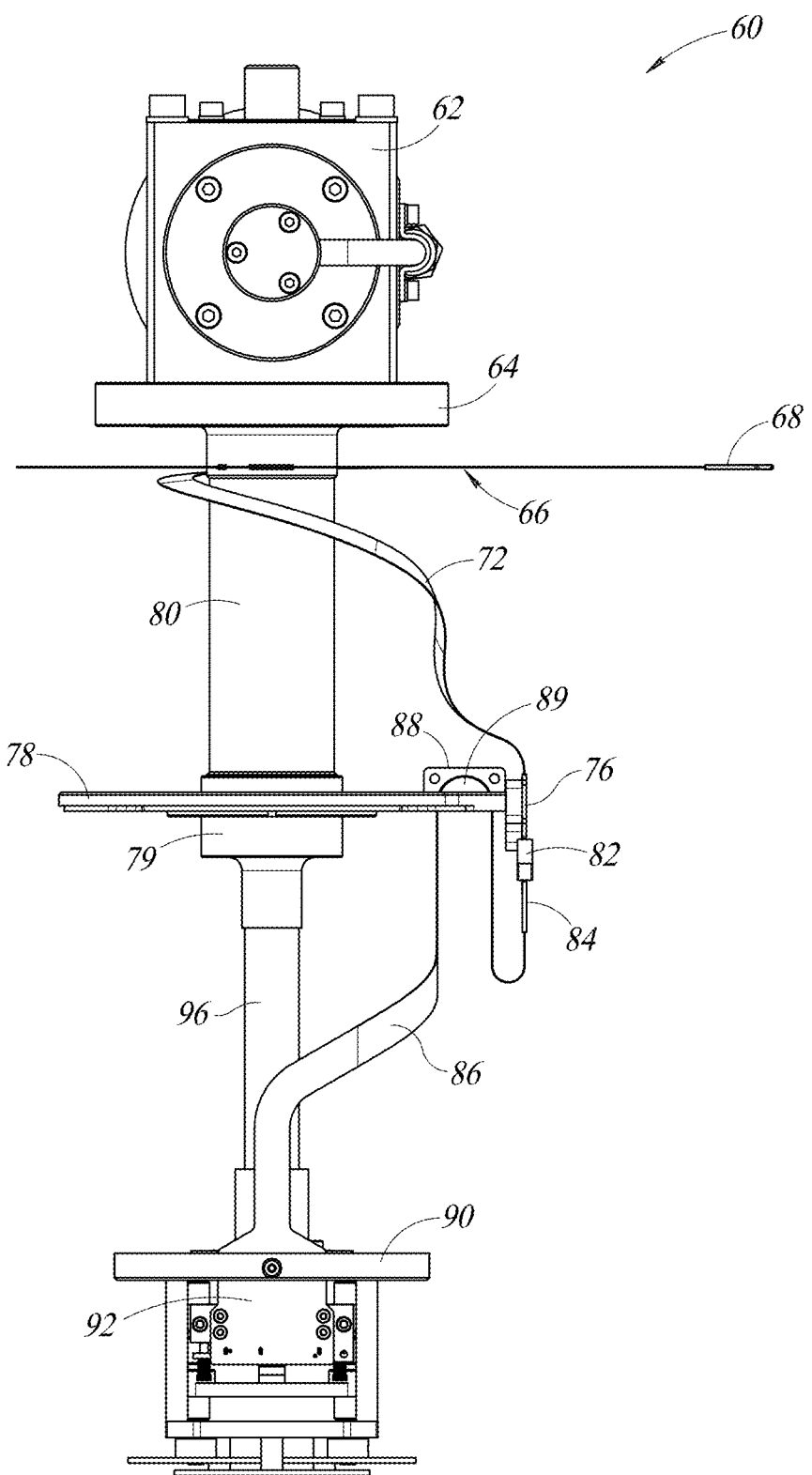
FIG. 3A is a diagram illustrating a side view of the example cryostat system using two printed flexible cables.

A diagram illustrating a side view of the example cryostat system that uses two printed flexible circuits is shown in FIG. 3A. The cryostat, generally referenced 60, comprises a cold head 62, mounting plate 64, TV-flex circuit 66, connector 68 that connects to outside the vacuum chamber, cryocooler first stage shaft 80, first stage plate 78, saddle 88 and anvil 89, TV-flex PCB connector 76, thermal isolating connector 82, cryo-flex PCB connection 84, cryocooler second stage shaft 96, second stage plate 90, and PCB assembly 92. Note that to optimize thermal conductivity, the copper used for the first and second stage plates may comprise annealed copper as annealed copper's thermal conductivity is much higher at low temperatures (e.g., 10K).

This figure highlights the spiral path 72 of the TV-flex cable 66 around the first stage cooling shaft 80. The annular sealing region is clamped between the vacuum cover and the housing. Also highlighted is the thermal anchor consisting of matched thermally conductive components 88, 89 that clamp the cryo-flex cable 86 to the first stage temperature of 30K. For example, the matched thermally conductive components may comprise matched concave and convex components such as a saddle and matching complimentary anvil. Electrical connector 82 also provides thermal isolation or discontinuity between the two flex cables.

Figure 3B:
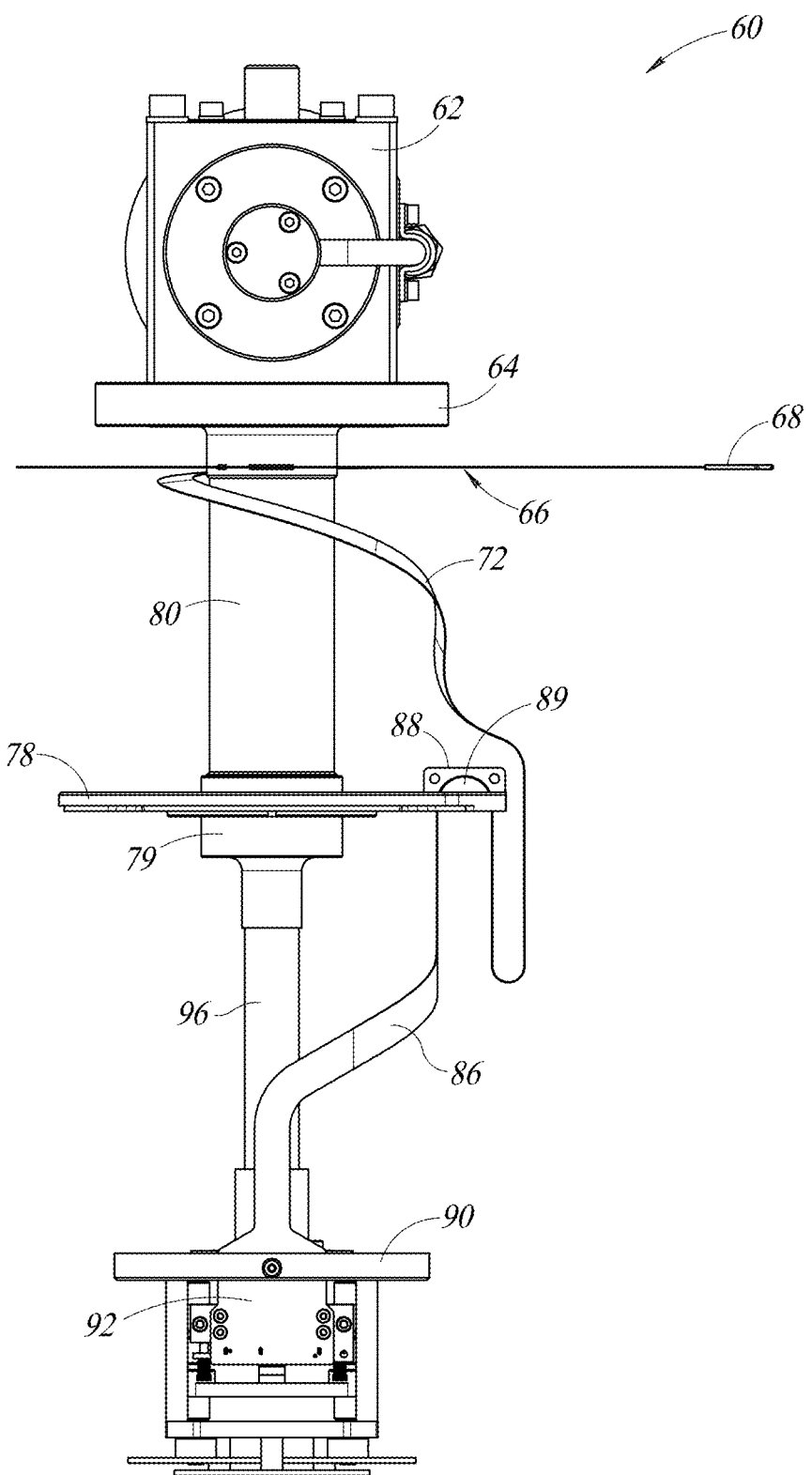
FIG. 3B is a diagram illustrating a side view of the example cryostat system using a single printed flexible cable.

A diagram illustrating a side view of the example cryostat system using a single printed flexible cable is shown in FIG. 3B. As described supra, the use of two flex cables with a thermal/electrical break between them versus using a single cable is more energy efficient. Use of a single flex cable, however, may also be used. In this case, the flex cable still passes through a thermal anchor consisting of matched thermally conductive components 88, 89. The connector that normally couples the two cables (FIG. 3A) is now eliminated as there is a direct connection between the air side of the vacuum chamber and the sample board on the vacuum side. Thus, the thermal isolation that was formerly provided by the connector 82 (FIG. 3A) has been removed.

Figure 4:
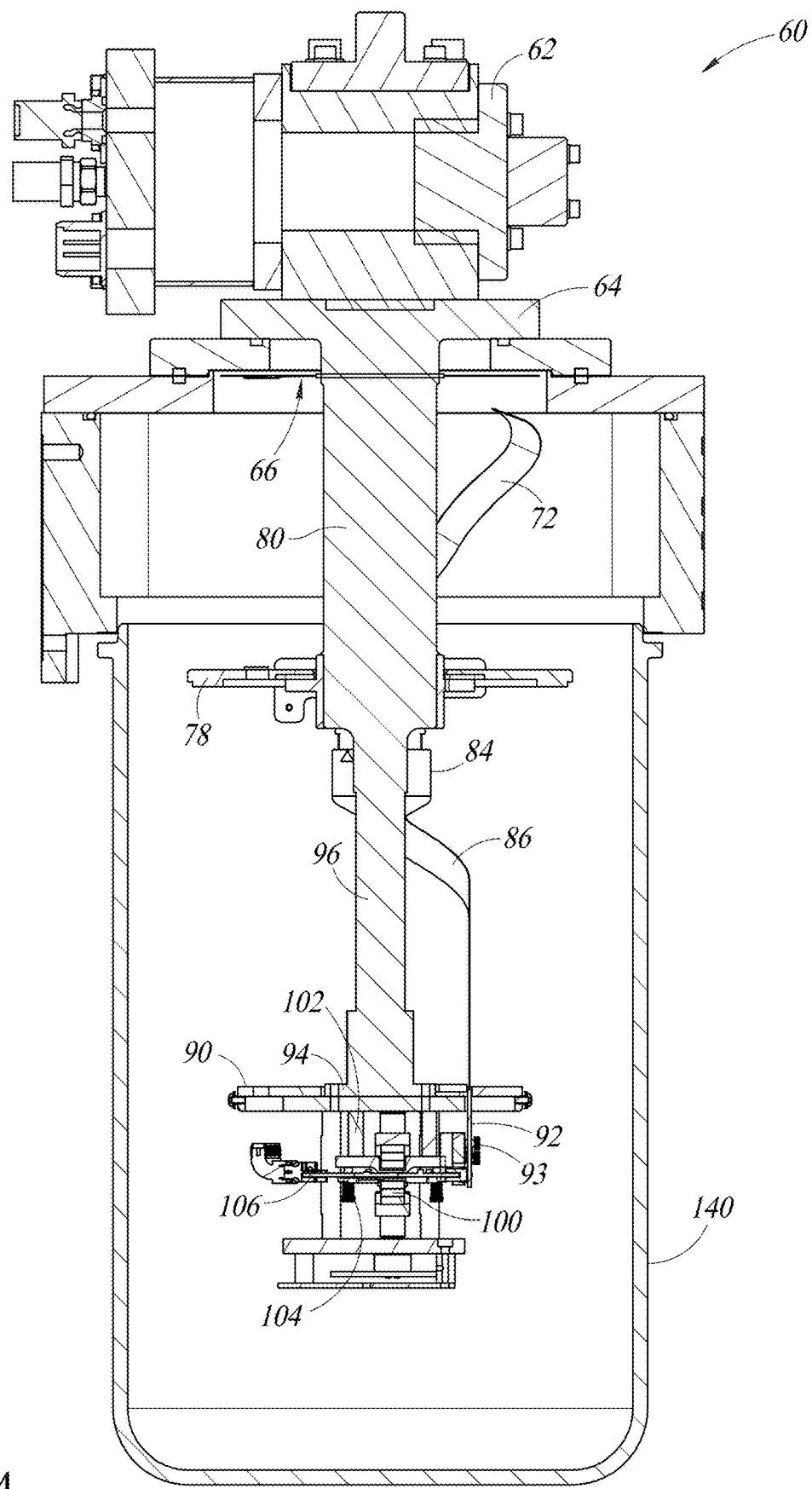
FIG. 4 is a diagram illustrating a cross sectional view of the example cryostat system including heat shield and cooling tower.

A diagram illustrating a cross sectional view of the example cryostat system including heat shield and cooling tower is shown in FIG. 4. The cryostat 60 comprises cold head 62, mounting plate 64, TV-flex circuit 66, spiral cable 72, cryocooler first stage shaft 80, first stage plate 78, cryo-flex PCB termination 84, cryo-flex cable 86, connector 82, cryocooler second stage shaft 96, second stage plate 90, second stage mounting plate 94, PCB assembly 92, PCB assembly mounting suspension springs 93, sample board 106, sample board mounting suspension springs 104, pillars or spacers 102 that connect the sample board 106 to the second stage cold plate 90 and mounting plate 94, adjustable magnets 100 that straddle the sample integrated circuit, and vacuum chamber bucket 140.

It is noted that both the PCB assembly 92 at the end of the cryo-flex cable 86 and the sample board 106 are suspended to allow for differential thermal expansion and contraction between temperature changes from low working temperatures (i.e. 3K) to room temperature (i.e. 300K).

Figure 5:
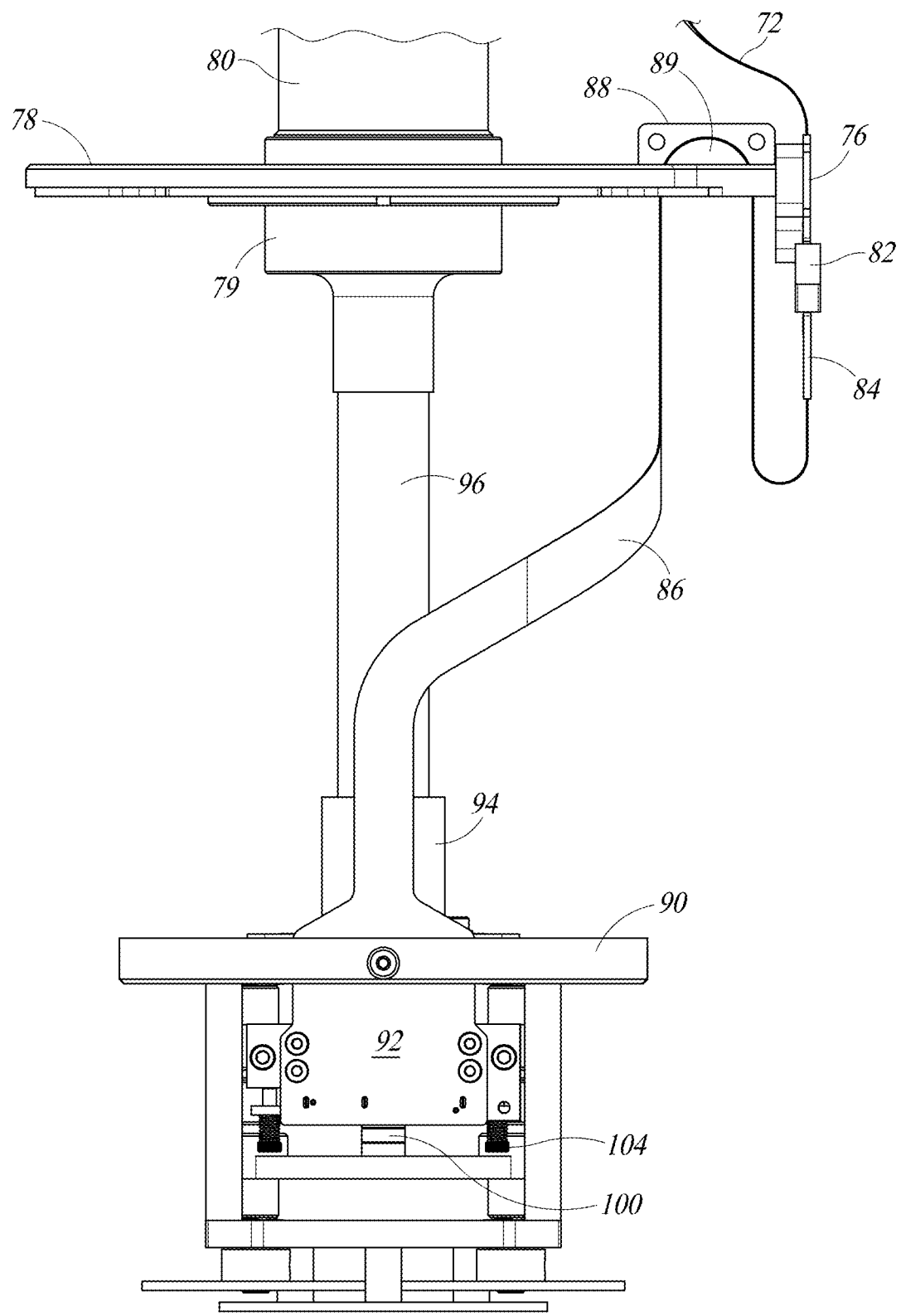
FIG. 5 is a diagram illustrating a side view of the example cryostat system showing the cryostat cable in more detail.

A diagram illustrating a side view of the example cryostat system showing the cryostat cable in more detail is shown in FIG. 5. The first stage cooling shaft 80 is coupled to the first stage cold plate 78 which is maintained at approximately 30K. The second stage cooling shaft 96 extends downward to second stage cold plate 90 and mounting plate 94 which is maintained at 3 degrees K. The TV-flex cable 72 terminates via PCB assembly 76 at connector 82. The cryo-flex cable 86 extends downward from PCB assembly 84 making a small loop and rises upward to saddle 88 and anvil 89 which form a thermal anchor at the first stage temperature of degrees K. The cryo-flex cable continues downward towards the second stage cooling plate and is terminated in PCB assembly 92 connected to the sample board (not shown). Mounting screws with springs provide adjustable tension between the cold contact plate and the integrated circuit. Magnet assembly 100 straddles the sample board as described in more detail infra.

Figure 6:
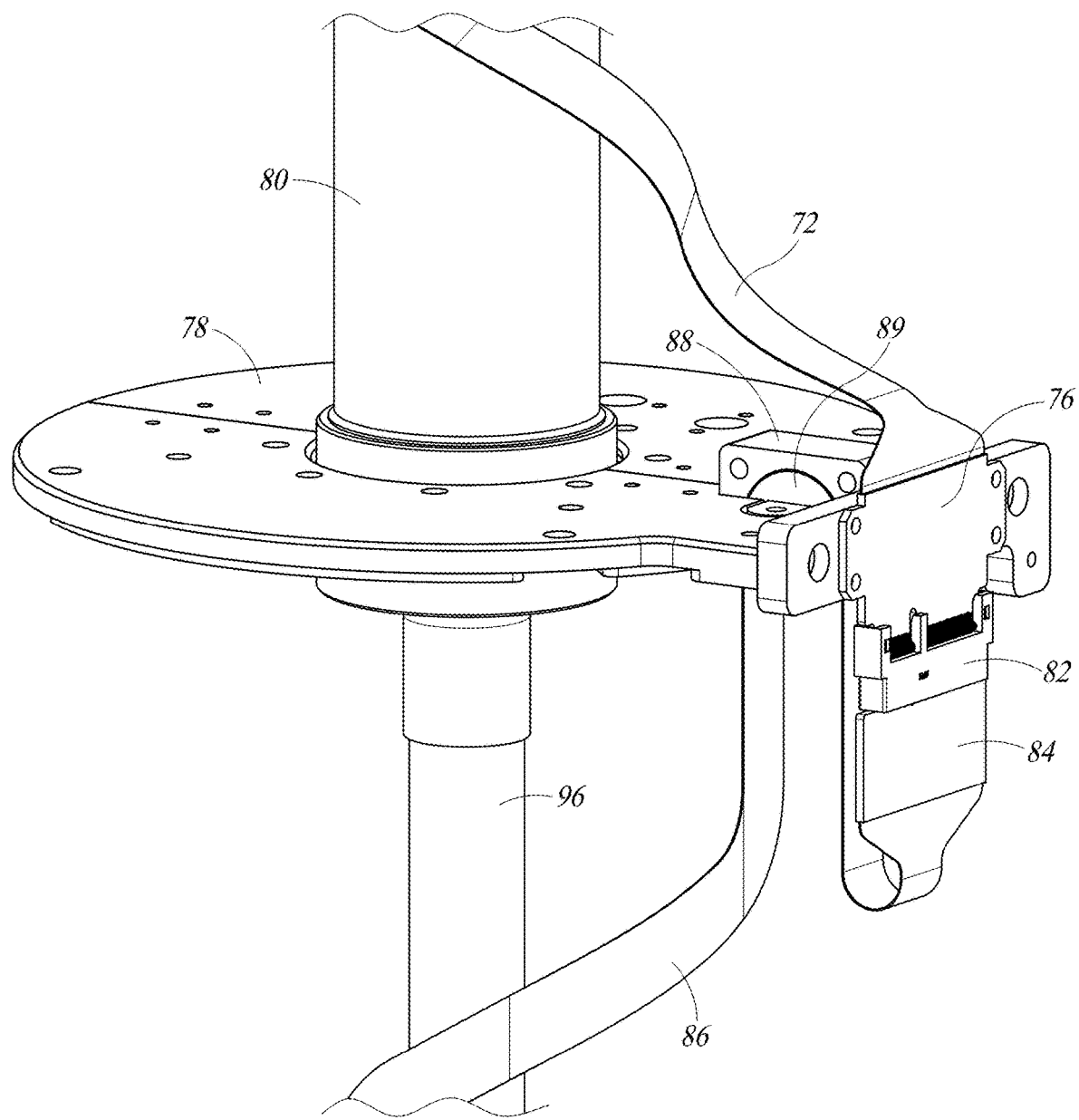
FIG. 6 is a diagram illustrating the connector interface between the two flex cables in more detail.

A diagram illustrating the connector interface between the two flex cables in more detail is shown in FIG. 6. The connector 82 provides good electrical conductivity between the TV-flex PCB assembly 76 and the cryo-flex PCB assembly 84. The connector 82 is adapted, however, to provide poor thermal conductivity and to thermally isolate the two flex cables. This helps prevent heat from traveling between the TV-flex cable 72 and the cryo-flex cable 86. The TV-flex PCB assembly 76 is also mechanically and thermally fastened to the first stage cold plate 78 which maintains the temperature at 30K. The saddle 88 and matching complimentary anvil 89 mechanically and thermally clamp the cryo-flex cable to form a thermal anchor to the first stage cold plate 78.

Figure 7:
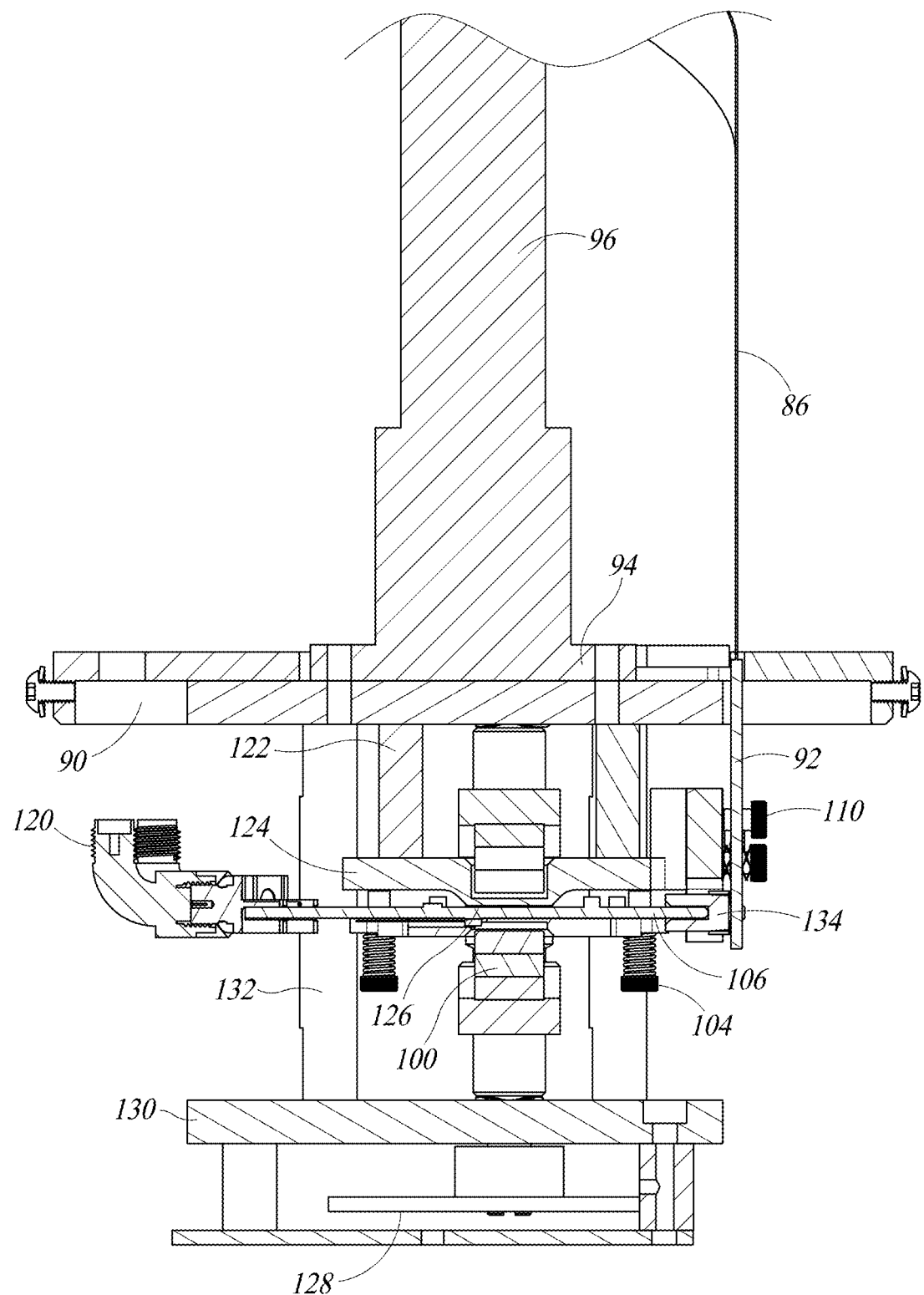
FIG. 7 is a diagram illustrating the suspended sample board mechanism in more detail.

A diagram illustrating the suspended sample board mechanism in more detail is shown in FIG. 7. As described supra, the second stage cooling shaft 96 terminates on cold plate 90 and mounting plate 94. The sample board 106 is electrically coupled through PCB connector 134 to PCB assembly 92 at the end of the cryo-flex cable 86. Metal (e.g., copper) pillar spacers 122 mechanically and thermally connect metal contact plate 124 to the second stage cold plate and mounting plate 94 while creating space for magnet assembly 100 that sandwiches the integrated circuit 126 being cooled. Set screws and springs 110 mechanically isolate the PCB assembly 92 from the contact plate 124 and second stage cold plates. Additional set screws and springs 104 mechanically isolate the sample board assembly 106 from the contact plate 124. In addition, they enable the adjustment of the force between the sample board and integrated circuit against the contact plate 124 which is physically and thermally in contact with the integrated circuit.

The magnet assembly 100 is adapted to be adjustably positioned above and below the quantum integrated circuit (IC) and functions to apply a magnetic field to control the spin of one or more quantum particles in the quantum IC.

Alternatively, the magnets may be omitted and the pillar spacers in this case would not be needed and the contact plate would be fastened directly to the cold plate 90. In another embodiment, the magnets are mounted so as not to apply a vertical magnetic field as shown in FIG. 7, but rather to apply a horizontal magnetic field to control the spin of one or more quantum particles in the quantum IC on the sample PCB. In this embodiment, the one or more magnets above and below the quantum IC would be arranged horizontally or on a steep angle.

Wheel assembly 128 enables adjustment of the height of the magnet assembly 100 above and below the integrated circuit. Plate 130 and pillars 132 provide mechanical support for the magnet assembly. In addition, RF connectors 120 receive RF signal inputs to the integrated circuit on the sample board.

In an alternative embodiment, the TV flex circuit is mounted on the side of the vacuum chamber rather than the top. The TV flex circuit uses the same vacuum sealing utilizing O-rings to seal against the annular sealing region portion of the flex circuit. A spiral tab extends into the vacuum chamber and is terminated in a thermally isolating electrical connector.

Figure 8:
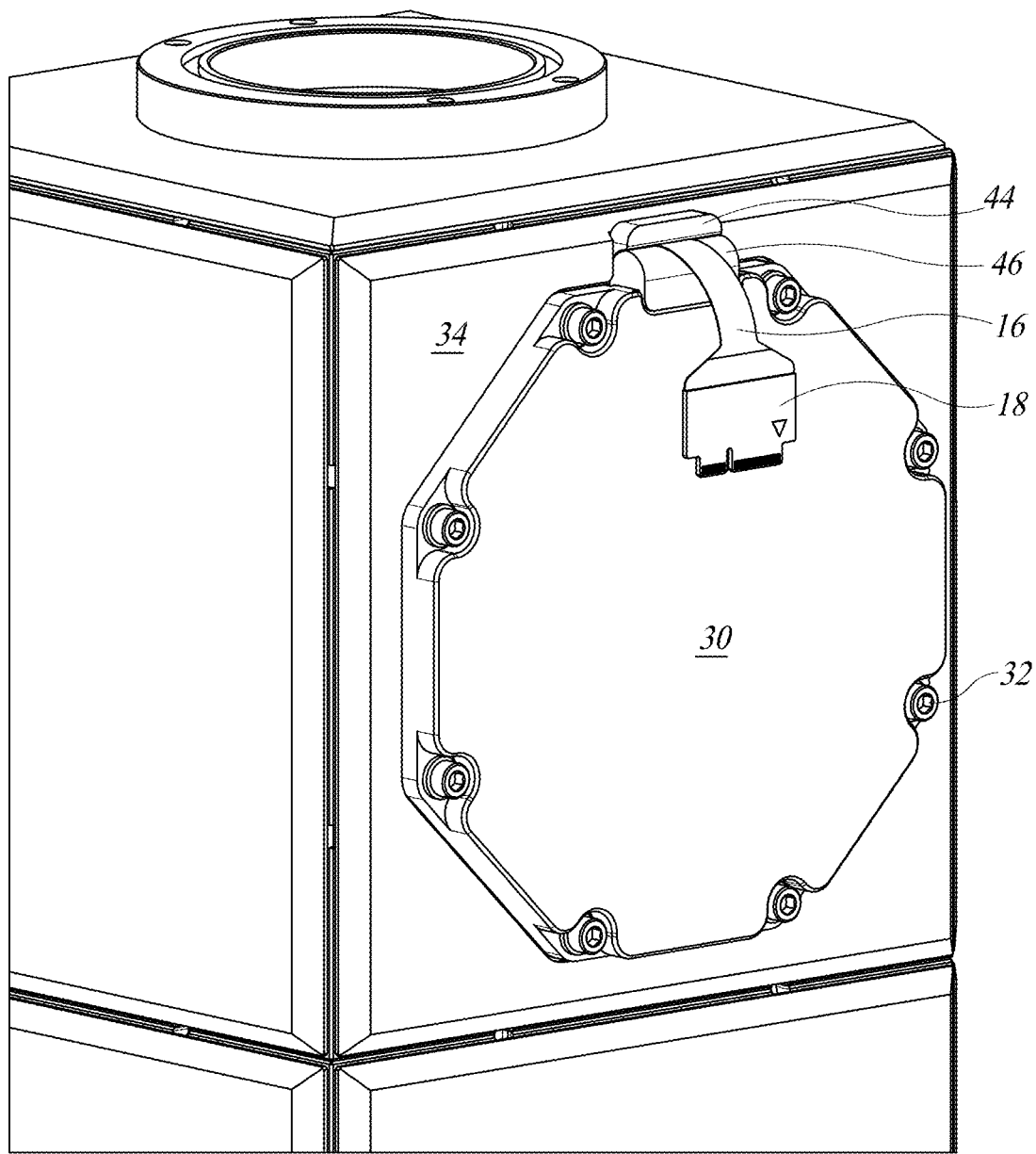
FIG. 8 is a diagram illustrating an outside view of an example trans-vacuum flexible printed circuit installed in a vacuum chamber with a rigid printed circuit board tab extending outward.

A diagram illustrating an outside view of an example trans-vacuum flexible printed circuit installed in a vacuum chamber with a rigid printed circuit board tab extending outward is shown in FIG. 8. The flex tab 16 and rigid PCB 18 of the TV flex circuit is shown extending outward from the vacuum chamber through a tension relief assembly 44, 46 that bends and holds the cable in place and ensures the flex circuit is not overstressed. Note that it does not play a role in thermal isolation or vacuum sealing. The cover plate 30 is shown bolted in position to the perimeter of the hole in the vacuum chamber 34 via a plurality of bolts 32.

In the configuration shown, the annular sealing region 12 (FIG. 2A) is a generally annular shaped continuous laminated flexible material whose outer perimeter is offset from the outer (e.g., octagonal) shape of a cover plate 30 (FIG. 8). In this example configuration, the seal expresses eight holes around the outer perimeter positioned to clear connector bolts 32 that hold the cover plate 30 to the perimeter of a hole in the vacuum chamber 34. The signal and power traces run across this flat annular seal, with an axial, flexible tab 16 out of the sealing region that develops into a flat and rigid multi-contact connector PCB 18 on the air side of the vacuum chamber. Those same signal and power traces run across this annular seal in the other direction, towards the center of it, developing into a flat and rigid multi-contact connector PCB 76 vacuum side of the vacuum chamber.

Figure 9:
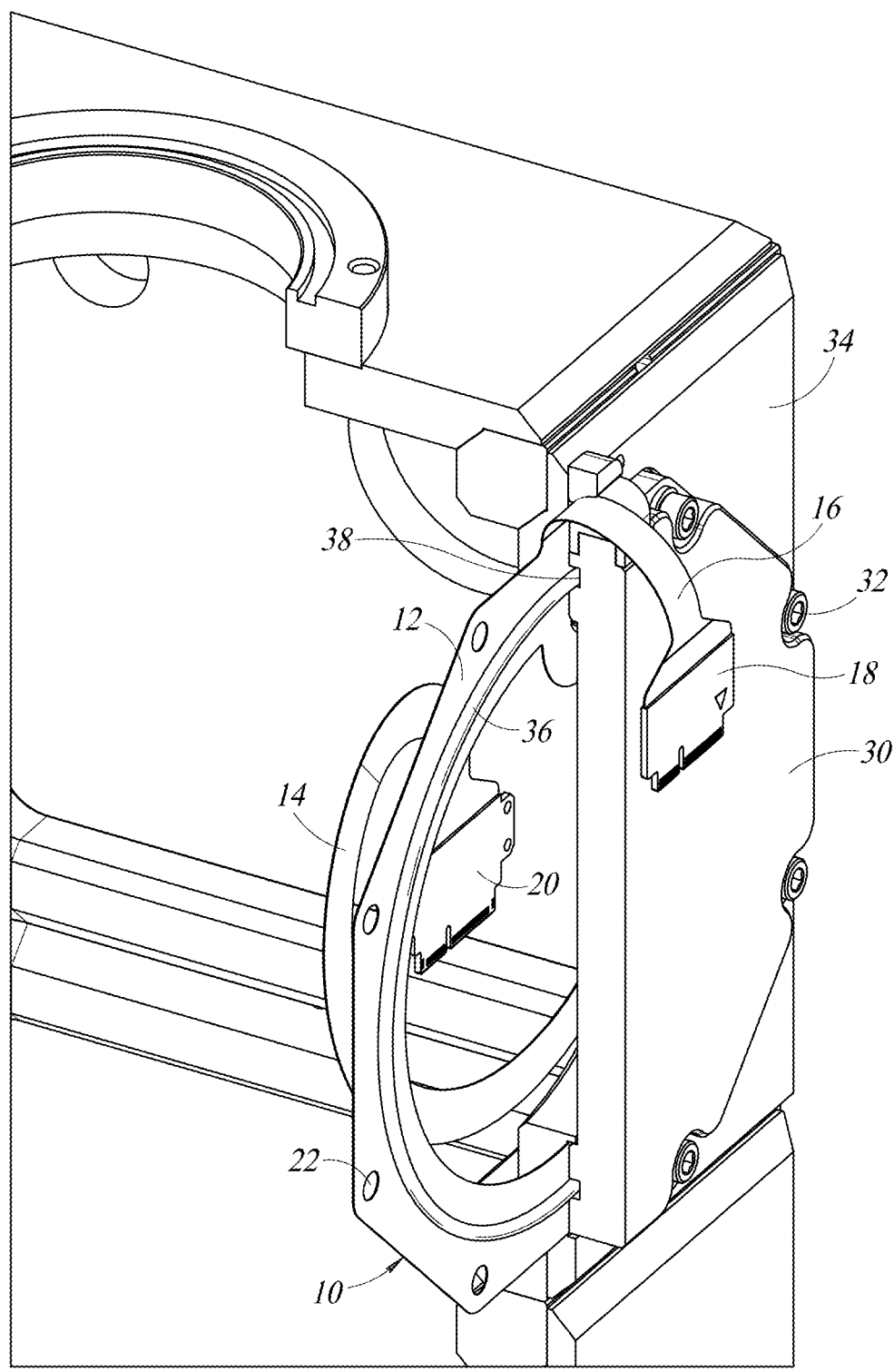
FIG. 9 is a diagram illustrating a forward cutaway view of an example trans-vacuum flexible printed circuit installed in a vacuum chamber with an O-ring seated against an annular sealing region.

A diagram illustrating a forward cutaway view of an example trans-vacuum flexible printed circuit installed in a vacuum chamber with an O-ring seated against an annular sealing region is shown in FIG. 9. In this view, an O-ring seal 36 is shown seated in a front groove 38 cut into the back side of the cover plate 30. The O-ring 36 is adapted to seal around the annular sealing region 12. Holes 22 allow bolts to pass through to fasten the cover plate 30 to the vacuum chamber 34.

Figure 10:
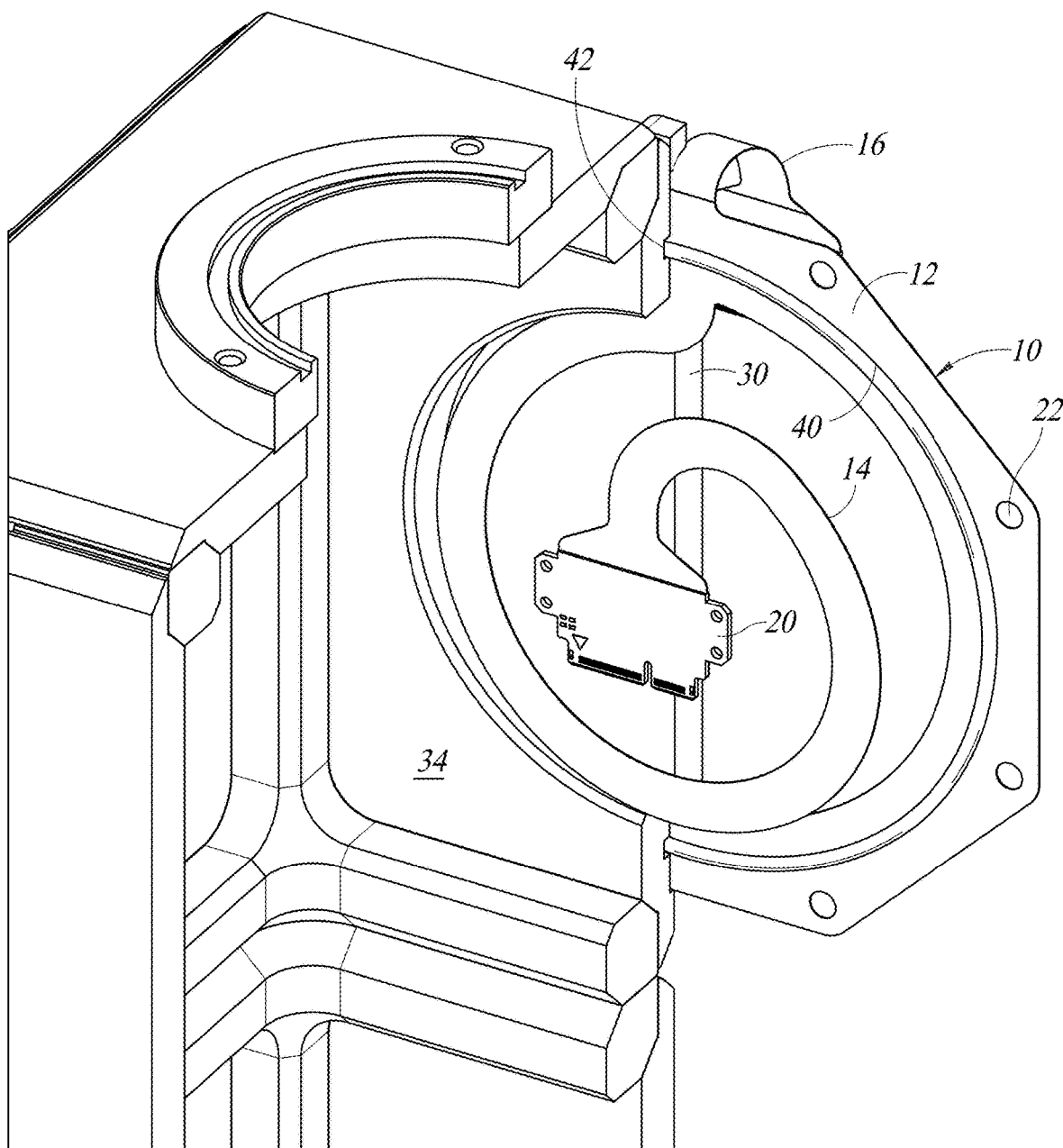
FIG. 10 is a diagram illustrating a rear cutaway view of an example trans-vacuum flexible printed circuit installed in a vacuum chamber with an O-ring seated against an annular sealing region.

A diagram illustrating a rear cutaway view of an example trans-vacuum flexible printed circuit installed in a vacuum chamber with an O-ring seated against an annular sealing region is shown in FIG. 10. In this view, an O-ring seal 40 is shown seated in a back groove 42 cut into the front perimeter of the hole in the vacuum chamber 34. The O-ring 40 is adapted to seal around the annular sealing region 12. Holes 22 allow bolts to pass through to fasten the cover plate 30 to the vacuum chamber 34.

Figure 11A:
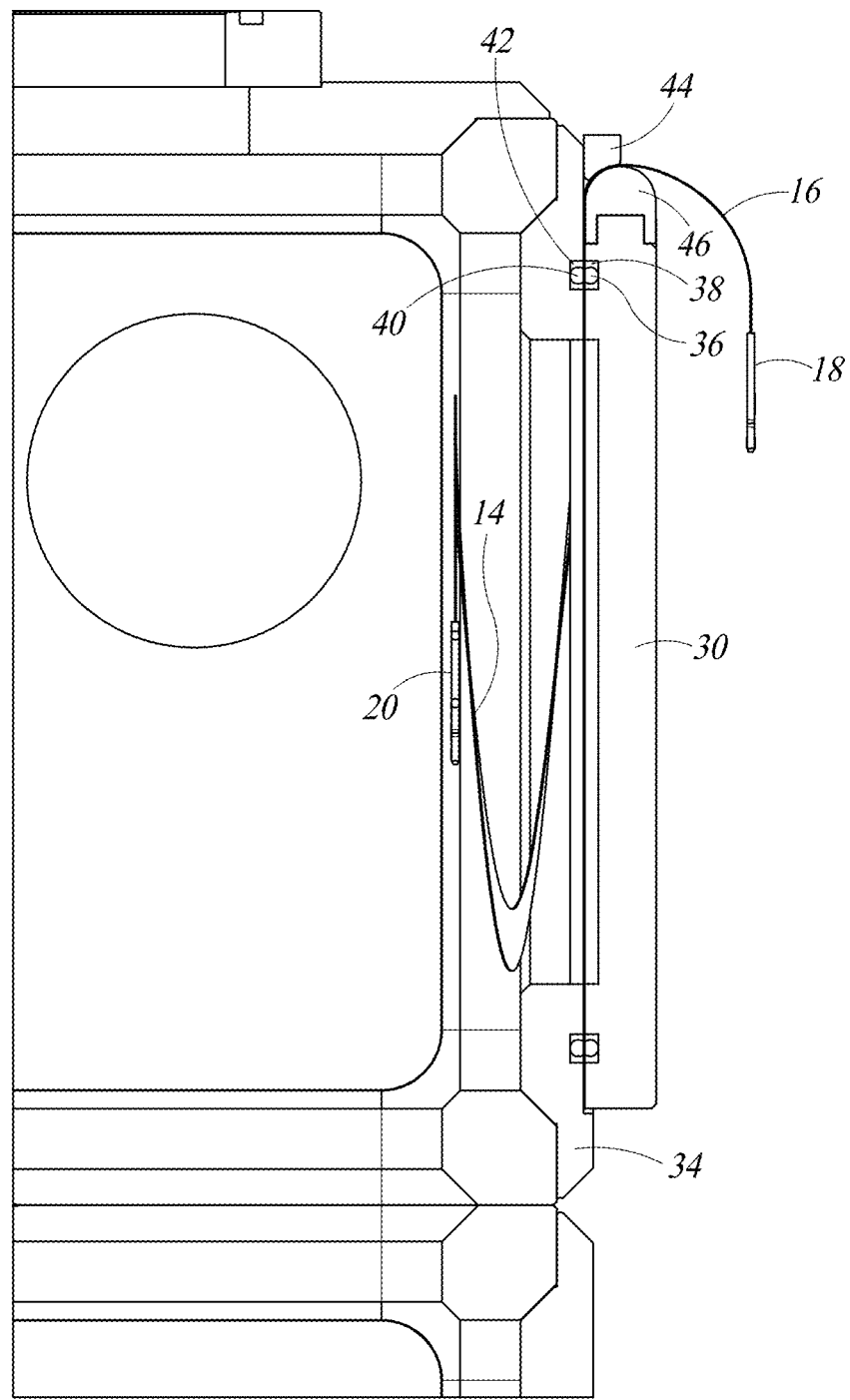
FIG. 11A is a diagram illustrating a sectional view of a first example trans-vacuum flexible printed circuit installed in a vacuum chamber with an annular sealing region sandwiched between two O-rings.

A diagram illustrating a side sectional view of a first example trans-vacuum flexible printed circuit installed in a vacuum chamber with an annular sealing region sandwiched between two O-rings is shown in FIG. 11A. The TV flex circuit 10 is shown mounted and sealed over the hole in the vacuum chamber 34. The annular sealing region 12 is sandwiched between the outer surface of the perimeter of the hole in the vacuum chamber and the inner surface of the cover plate 30. Grooves 42, 38 hold elastomeric O-rings 40, 36, respectively, that sandwich the annular sealing region 12 to create the vacuum seal. Electrical signals pass from PCB connector 18 through flex tab 16 through saddle 44, 46, cross the annular sealing region axially or otherwise and pass through spiral flex tab 14 to PCB 20.

Since the cover plate 30 is exposed to air it typically sits at room temperature 300K. This is the temperature that the TV flex cable gets anchored. The temperature inside the vacuum chamber is maintained at 30K. Thus, there is a gradient along the TV-flex cable tab to the first stage rigid PCB connector. Note that heat convection is minimal because of the vacuum maintained inside the chamber. Radiated heat is handled by the first stage cooler which in one embodiment is rated at 50 W. Radiated heat is received and reflected via the heat shield made of gold plated copper.

The flexible printed circuits of the present invention are typically constructed from well-known materials used such as Kapton, polyimide, etc. Any material used should preferably have low outgassing, be suitable for use in a vacuum and at low temperatures, have good electrical performance, exhibit low insertion loss and good isolation.

In one embodiment, the annular flex material sealing region is sufficiently wide for annular vacuum seals (e.g., elastomeric O-rings 36, 40, etc.) to seal off on both its top side and bottom side, creating vacuum seals between the outer sealing surface of the hole into the vacuum chamber and the underside of the flex material sealing region 12, and the top side of the flex material sealing region and the underside sealing surface of the vacuum cover plate 30.

Figure 11B:
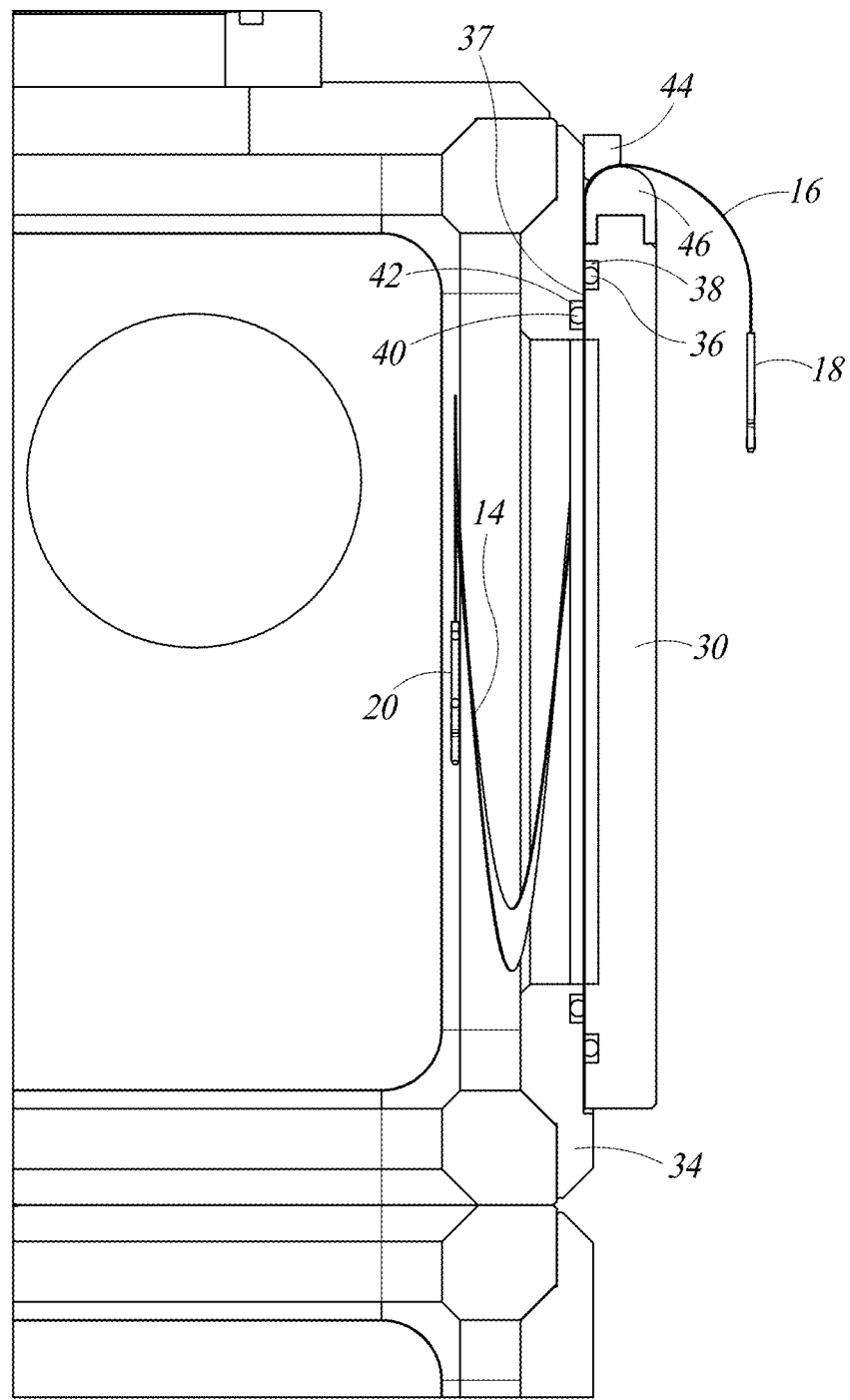
FIG. 11B is a diagram illustrating a sectional view of a second example trans-vacuum flexible printed circuit installed in a vacuum chamber with an annular sealing region sandwiched between two O-rings.

Note that in one embodiment, the annular vacuum seals can be concentric, and they can be the same size so they compress the TV flex material sealing region directly between them. Alternatively, the centers of the annular vacuum seals can be offset and/or their diameters can be different to each other, so that they compress the flex material sealing region between themselves and a rigid component surface opposite them, i.e. (1) the outer sealing surface of the hole into the vacuum chamber, (2) the underside sealing surface of the vacuum cover plate, or (3) other intermediate sealing components or features. In addition, the two O-ring seals do not necessarily have the same diameter as one may have a larger diameter than the other to improve sealing. This alternative embodiment is shown in FIG. 11B where the inner O-ring 40 on the vacuum side has a smaller diameter than the outer O-ring 36 on the air side. Note that in the embodiment shown, a 'buffer' distance or gap 37 is inserted between the two O-ring channels to improve the vacuum sealing performance. In addition, the inner O-ring 40 on the vacuum side may have a larger diameter than the outer O-ring 36 on the air side.

Moreover, the annular vacuum seals (e.g., O-rings) can employ different shaped cross-sections, such as round, oval, square, rectangular, X-shaped or any combination of these cross-section shapes. Further, the annular vacuum seals are not limited to elastomeric seals and may comprise non-elastomeric seals such as crush seals. In addition, the TV flex circuit and/or the annular vacuum seals can be non-circular in plan view.

The flexible tabs into and out of the TV flex circuit annular sealing region can be otherwise advantageously shaped. It can be shaped as a spiral on the inside, for example, to extend the service length of the inner flex tab or otherwise control its path into the vacuum chamber. Similarly for the outward pointing tab, but with greater design freedom because of the unlimited space around the outside of the annular vacuum seal.

Note that the flexible tabs into and out of the trans-vacuum sealing region need not traverse the vacuum seal shape axially, but can advantageously traverse the seal at other angles from axial to tangential, and/or along indirect paths around the annular vacuum sealing region.

Note also that the electrical traces that traverse the trans-vacuum sealing region can be split to form multiple connectors and connector types into and out of the vacuum chamber. Thus, any number of connectors may extend out of the annular sealing region into the air side as well as extend out of the annular sealing region into the vacuum chamber side.

Note that in one embodiment, the connector connecting the TV-flex and cryo-flex cables are not fabricated from copper but rather from copper beryllium or copper phosphor bronze. Both of these metals are poor electrical conductors at 30K thus the connector contacts are gold plated. Preferably, the connector is also a good thermal isolator making a high thermal 'impedance' connection to prevent any heat present on the flex cable from traveling toward the sample board. Typically, there is a thermal gradient along the TV-flex cable. Thus, a thermal break point is placed along the path of the TX-flex cable, cryo-flex cable, or both cables. It is noted that the copper that is used for the traces of the cables gets more conductive as it gets colder. Therefore, the largest gradient occurs near the 300K side (i.e. the air side) of the cable. Both the connector and the thermal anchor provide a needed thermal break, hence the use of two cables rather than one where the thermal isolation helps to keep the heat away from the sample board.

In one embodiment, one or more RF signals pass from outside the vacuum chamber, through the wall of the chamber via connectors mounted in holes to the one or more RF connectors 120 (FIG. 7) mounted on the suspended sample board 106. These signal may comprise clock and in/out data signals forming a high speed interface (HSIO).

Figure 12:
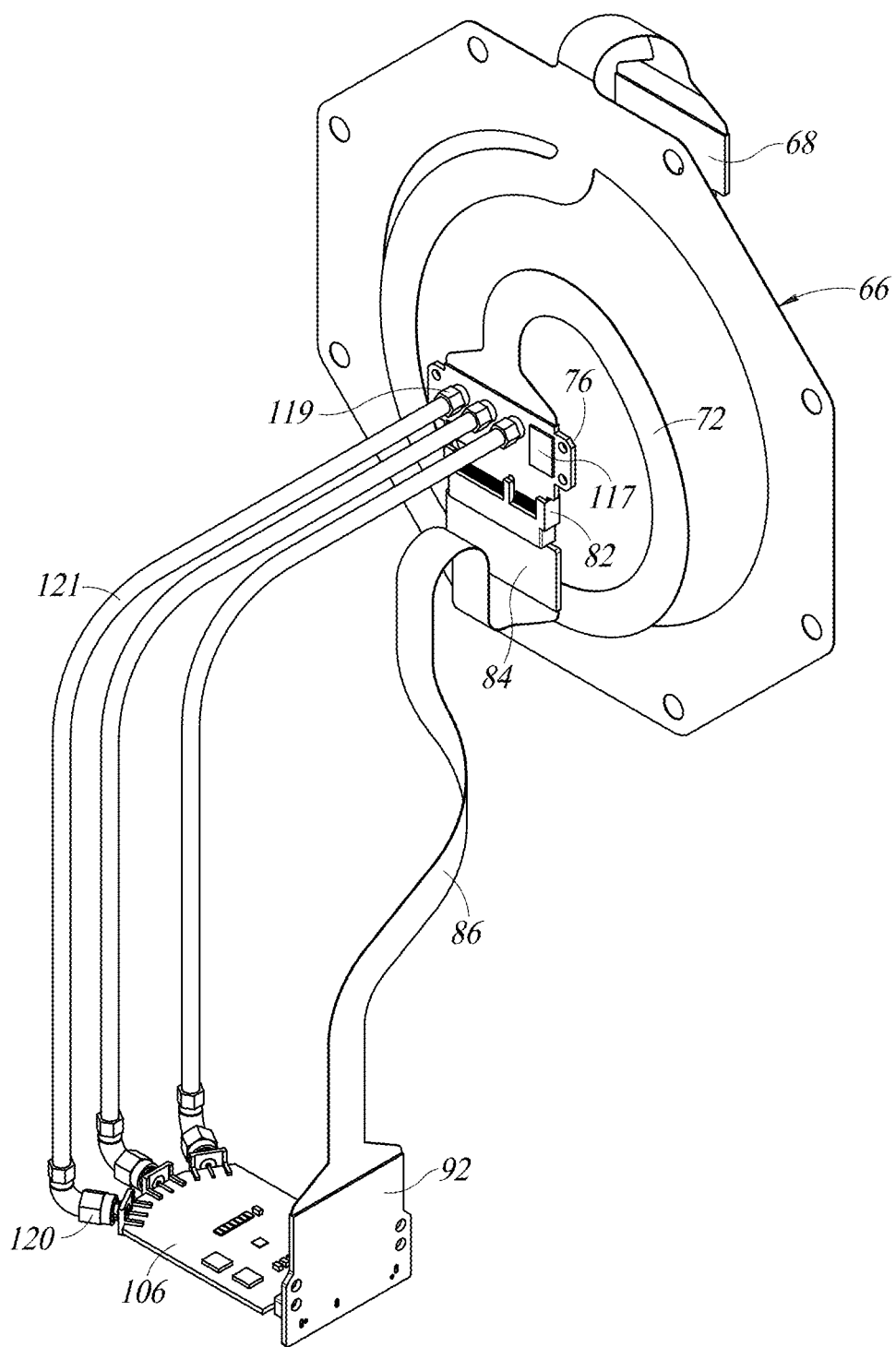
FIG. 12 is a diagram illustrating example RF signal cables extending from the trans-vacuum flexible printed circuit to the suspended sample board.

In an alternative embodiment, the RF signals are generated within the vacuum chamber via circuitry on the rigid PCB terminal end of the TV flex cable. A diagram illustrating example RF signal cables extending from the trans-vacuum flexible printed circuit to the suspended sample board is shown in FIG. 12. In this embodiment, rather than pierce the walls of the vacuum chamber, a lower frequency reference signal (e.g., <50 MHz) is provided over the TV flex cable from the air side and a phase locked loop (PLL)

or other suitable frequency multiplier circuit is used to generate the required clock signal (e.g., in the gigahertz frequency range) and any other required clocks and data signals. The PLL circuitry and one or more RF connectors are mounted on the PCB assembly 76 and RF cables 121 provide a connection between the PCB assembly 76 and the RF connectors 120 on the sample board 106. This eliminates the need to provide holes in the vacuum chamber simplifying fabrication and reducing potential vacuum leakages.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the claims, any reference signs placed between parentheses shall not be construed as limiting the claim. The use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first," "second," etc. are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A trans-vacuum flexible wiring apparatus for use in a cryostat, comprising:
    a flat laminated flexible material having an annular shaped sealing region able to be vacuum sealed between a cover plate and a perimeter of a hole in a vacuum chamber of the cryostat; and
    a plurality of electrically conductive traces that cross said annular shaped region thereby passing electrical signals between an air side and a vacuum side of the cryostat.

2. The trans-vacuum flexible wiring apparatus according to claim 1, wherein said flat laminated flexible material comprises flexible printed circuit board material including Kapton and/or polyimide.

3. The trans-vacuum flexible wiring apparatus according to claim 1, further comprising a plurality of holes around an outer perimeter of said annular shaped sealing region positioned to clear connector bolts for securing the cover plate to the vacuum chamber.

4. The trans-vacuum flexible wiring apparatus according to claim 1, wherein said plurality of electrically conductive traces pass axially through one or more first tabs extending out of said annular shaped sealing region to the air side of the cryostat and terminate in a flat rigid multi-contact connector printed circuit board (PCB).

5. The trans-vacuum flexible wiring apparatus according to claim 1, wherein said plurality of electrically conductive traces pass axially through one or more second tabs extending out of said annular shaped sealing region towards its center to the vacuum side of the cryostat and terminate in a flat rigid multi-contact connector printed circuit board (PCB).

6. The trans-vacuum flexible wiring apparatus according to claim 5, wherein said second tab comprises a spiral shape thereby extending a service length of said second tab.

7. The trans-vacuum flexible wiring apparatus according to claim 1, further comprising annular concentric vacuum seals on either side of said annular shaped sealing region that are operative to compress and seal said annular shaped region therebetween.

8. The trans-vacuum flexible wiring apparatus according to claim 7, wherein said annular concentric vacuum seals either have the same diameters and centers or have different diameters and centers that are offset from each other.

9. The trans-vacuum flexible wiring apparatus according to claim 1, wherein said annular concentric vacuum seals are selected from the group consisting of elastomeric O-rings, non-elastomeric O-rings, and crush seals.

10. The trans-vacuum flexible wiring apparatus according to claim 1, wherein said annular concentric vacuum seals comprise a cross section selected from the group consisting of round, square, rectangular, oval, and x-shaped.

11. The trans-vacuum flexible wiring apparatus according to claim 1, wherein said plurality of electrically conductive traces traverse said annular shaped sealing region at a tangential angle.

12. The trans-vacuum flexible wiring apparatus according to claim 1, wherein said plurality of electrically conductive traces is fabricated on a plurality of printed layers and include at least top and bottom electromagnetic shielding layers consisting of a non-solid mesh pattern selected from the group consisting of diamonds, hexagons, octagons, honeycombs, and polygons.

13. The trans-vacuum flexible wiring apparatus according to claim 1, further comprising rigid printed circuit board (PCB) assemblies that terminate a plurality of electrically conductive traces at either end of said wiring apparatus.

14. The trans-vacuum flexible wiring apparatus according to claim 13, wherein at least one of said rigid PCB assemblies further comprises one or more RF connectors and circuitry for generating one or more high frequency RF signals from a low frequency reference signal for use on a sample board.

15. A trans-vacuum flexible wiring apparatus for use in a cryostat, comprising:
   a continuous annular shaped laminated flexible material having a concentric sealing region able to be vacuum sealed between a cover plate and a perimeter of a hole in a vacuum chamber of the cryostat and whose outer perimeter is offset from an outer shape of the cover plate; and
   a plurality of electrically conductive printed traces that axially cross said annular laminated flexible material thereby passing signals between one or more first flexible tabs from an air side of the cryostat and one or more second flexible tabs on a vacuum side of the cryostat.

16. The trans-vacuum flexible wiring apparatus according to claim 15, wherein
   said plurality of electrically conductive traces pass axially through one or more first tabs extending out of said annular shaped sealing region to the air side of the cryostat and terminate in a flat rigid multi-contact connector printed circuit board (PCB); and
   said plurality of electrically conductive traces pass axially through one or more second tabs extending out of said annular shaped sealing region towards its center to the vacuum side of the cryostat and terminate in a flat rigid multi-contact connector printed circuit board (PCB).

17. The trans-vacuum flexible wiring apparatus according to claim 15, further comprising annular concentric vacuum seals on either side of said annular shaped sealing region that are operative to compress and seal said annular shaped region therebetween.

18. The trans-vacuum flexible wiring apparatus according to claim 15, wherein said annular concentric vacuum seals are selected from the group consisting of elastomeric O-rings, non-elastomeric O-rings, and crush seals.

19. A trans-vacuum flexible wiring apparatus for use in a cryostat, comprising:
   a flat laminated flexible material having a plurality of printed layers and an annular shaped sealing region able to be vacuum sealed between a cover plate and a perimeter of a hole in a vacuum chamber of the cryostat; and
   a plurality of electrically conductive traces fabricated on said plurality of printed layers that cross said annular shaped region thereby passing electrical signals between an air side and a vacuum side of the cryostat.

20. The trans-vacuum flexible wiring apparatus according to claim 19, wherein said plurality of printed layers comprises at least top and bottom electromagnetic shielding layers consisting of a non-solid mesh pattern selected from the group consisting of diamonds, hexagons, octagons, honeycombs, and polygons.

* * * * *